US012034434B2

(12) United States Patent
Cassella

(10) Patent No.: US 12,034,434 B2
(45) Date of Patent: Jul. 9, 2024

(54) HIGH QUALITY FACTOR INTEGRATED ACOUSTIC RESONANT METAMATERIALS WITH LARGE FREQUENCY TUNING RANGE FOR RECONFIGURABLE RADIO-FREQUENCY FRONT-ENDS

(71) Applicant: Northeastern University, Boston, MA (US)

(72) Inventor: Cristian Cassella, Boston, MA (US)

(73) Assignee: Northeastern University, Boston, MA (US)

( * ) Notice: Subject to any disclaimer, the term of this patent is extended or adjusted under 35 U.S.C. 154(b) by 255 days.

(21) Appl. No.: 17/627,196

(22) PCT Filed: Aug. 24, 2020

(86) PCT No.: PCT/US2020/047638
§ 371 (c)(1),
(2) Date: Jan. 14, 2022

(87) PCT Pub. No.: WO2021/041315
PCT Pub. Date: Mar. 4, 2021

(65) Prior Publication Data
US 2022/0321104 A1 Oct. 6, 2022

Related U.S. Application Data

(60) Provisional application No. 62/890,705, filed on Aug. 23, 2019.

(51) Int. Cl.
| | | |
|---|---|---|
| *H03H 9/62* | (2006.01) | |
| *H03B 5/32* | (2006.01) | |
| *H03B 5/36* | (2006.01) | |
| *H03H 3/013* | (2006.01) | |
| *H03H 9/02* | (2006.01) | |
| *H03H 9/135* | (2006.01) | |

(Continued)

(52) U.S. Cl.
CPC ............... *H03H 9/62* (2013.01); *H03B 5/32* (2013.01); *H03B 5/36* (2013.01); *H03H 3/013* (2013.01); *H03H 9/02062* (2013.01); *H03H 9/135* (2013.01); *H03H 9/22* (2013.01); *H03H 9/568* (2013.01); *H03L 7/099* (2013.01)

(58) Field of Classification Search
CPC .......... H03H 9/62; H03H 3/013; H03H 9/135; H03H 9/22; H03H 9/02062; H03H 9/568; H03H 9/02228; H03B 5/36; H03B 5/32; H03L 7/099
USPC ............................. 331/116 M, 154; 333/193
See application file for complete search history.

(56) References Cited

U.S. PATENT DOCUMENTS

| | | | |
|---|---|---|---|
| 4,137,470 A | | 1/1979 | Désormière et al. |
| 11,239,823 B1 * | | 2/2022 | Kubena ............... H01Q 9/0464 |

(Continued)

FOREIGN PATENT DOCUMENTS

| | | |
|---|---|---|
| WO | 2017210373 A1 | 12/2017 |
| WO | 2019016514 A1 | 1/2019 |
| WO | 2019106157 A1 | 6/2019 |

*Primary Examiner* — Arnold M Kinkead
(74) *Attorney, Agent, or Firm* — Verrill Dana, LLP

(57) ABSTRACT

Piezoelectric acoustic metamaterial resonators include a piezoelectric substrate having a top surface and a bottom surface and a plurality of magnetostrictive members disposed on the top surface of the piezoelectric substrate and extending along a length of the piezoelectric substrate and spaced across a width of the piezoelectric substrate.

23 Claims, 14 Drawing Sheets

(51) Int. Cl.
*H03H 9/22* (2006.01)
*H03H 9/56* (2006.01)
*H03L 7/099* (2006.01)

(56) References Cited

U.S. PATENT DOCUMENTS

| | | |
|---|---|---|
| 2002/0166382 A1 | 11/2002 | Bachas et al. |
| 2004/0053590 A1 | 3/2004 | Marholev |
| 2007/0108973 A1 | 5/2007 | Lanning et al. |
| 2008/0061895 A1 | 3/2008 | Kelkar et al. |
| 2008/0079515 A1 | 4/2008 | Ayazi et al. |
| 2008/0205543 A1 | 8/2008 | Rofougaran |
| 2010/0311383 A1 | 12/2010 | Abbaspour-Tamijani et al. |
| 2013/0038323 A1 | 2/2013 | Honkura et al. |
| 2015/0168503 A1 | 6/2015 | Kim et al. |
| 2018/0115294 A1 | 4/2018 | Gong et al. |

\* cited by examiner

FIG. 13

HIGH QUALITY FACTOR INTEGRATED ACOUSTIC RESONANT METAMATERIALS WITH LARGE FREQUENCY TUNING RANGE FOR RECONFIGURABLE RADIO-FREQUENCY FRONT-ENDS

CROSS REFERENCE TO RELATED APPLICATIONS

This application claims the priority of U.S. Provisional Application No. 62/890,705, filed 23 Aug. 2019 and entitled "High Quality Factor Integrated Acoustic Resonant Metamaterials with Large Frequency Tuning Range for Reconfigurable Radio-Frequency Front-Ends", the whole of which is hereby incorporated by reference.

BACKGROUND

In the last decade, the growing demand of service bands in mobile communication systems and for miniaturized front-ends have increased the need for agile radio-frequency (RF) technologies, enabling large tunability through compatible complementary-metal-oxide (CMOS) fabrication processes. In particular, the achievement of reconfigurable filters and tunable matching networks, ensuring optimal performance and a wide frequency tuning range, has represented a key objective for RF designers to minimize the form factor of multiband radios. In parallel, much attention has been paid to the achievement of low voltage, low phase-noise and large tuning range voltage controlled oscillators (VCOs). Such components, which are key building blocks of frequency synthesizers, generally rely on integrated low quality factor (Q) tunable LC tanks. These tanks, characterized by a large form factor, provide a limited frequency stability and, consequently, levels of jitter not compatible with the growing need for higher communication data-rates. Ultimately, the advent of 5G and the diffusion of the internet-of-things (IoT) have further increased the congestion of the available spectrum and posed strict limits on the maximum tolerable front-end power consumption in favor of an acceptable battery lifetime. As a result, currently available radios are more likely to suffer from significant performance degradation, or even a complete loss of functioning, when operating in presence of strong co-site interference or intentional jamming. For this reason, a large research effort has been made to produce instinctual protection systems, such as frequency selective limiters (i.e. a class of power dependent notch filters), that could prevent the receiver of low-power front-ends from capturing undesired high-power tones, while enabling proper reception of the useful low power information.

Although the systems described above are used to address different objectives in the RF-chain, they all would gain a large benefit from the existence of a passive high quality factor (Q), low-power tunable RF resonant technology that could be manufactured through CMOS compatible fabrication processes. In fact, by having access to such unprecedented resonant technology, it would be possible to: i) dynamically change the position of poles and zeros in an acoustic filter, ii) tune the output frequency of miniaturized ultra-stable VCOs and iii) dynamically control the center frequency of notches activated in presence of interference signals that must be suppressed.

Despite all of the research and development invested in smaller, lower-power integrated-circuits (IC) for radio-frequency (RF) transceivers capable of processing steadily increasing volumes of information, ICs suitable for use with next-generation RF transceivers remain elusive. In particular, small, CMOS manufacturable ICs having a small form factor and low-power usage do not exist that are capable of meeting the requirements of next-generation technologies.

Thus, there is an urgent need for highly tunable RF integrated components, capable of ensuring a reliable and fast exchange of massive data. For instance, the recent development of advanced applications, such as cloud-storage, edge computing, machine learning, artificial intelligence ("AI"), and fifth generation ("5G") wireless communication, as well as the promise of next generation applications such as sixth generation ("6G") wireless communication and "terabit" Ethernet (400 GbE and 800 GbE) have fueled the challenging quest for tunable and ultra-stable integrated RF frequency synthesizers and generators ("FSs"), enabling wireless and wired data-links with record-low bit-error-rates ("BERs"). In the meantime, the expanding Internet of Things ("IoT") is adding new challenges to the sharing of the available spectrum by increasing numbers of wireless devices, addressing the heterogeneous needs of emerging smart applications.

Although several communication protocols have been developed to strengthen the immunity of IoT wireless systems to interference, the effectiveness of these protocols lowers with the increasing number of volatile co-located wireless devices, trying to communicate in the same frequency band. Also, this performance degradation becomes even more critical when IoT wireless systems are exposed to strong interference signals that heavily compromise the linearity of their receivers ("RXs"). As a possible solution for these limitations, new passive and tunable RF channel-select-filters ("CSFs"), capable to largely attenuate any strong interference due to adjacent communication channels and to enable a fast hop of the used carrier, would be essential in order to achieve IoT devices with higher interference resilience.

For decades, the access to RF integrated components, exhibiting high performance and a largely tunable electrical response, has represented an unrealistic dream. In fact, while Aluminum Nitride ("AlN") Lamb wave Bulk-Acoustic-Wave (BAW) devices paved a revolutionary way towards the static integrated filtering stages used by modern commercial RF front-ends, as discussed above, their acoustic features and material characteristics have prevented their adoption to build highly tunable systems. Thus, passive ICs still rely on tunable LC-tanks to achieve a reconfigurable electrical response. However, integrated LC-tanks cannot be used to form CSFs for the low-power RF front-ends of available IoT devices, due to the large chip-area and to the low quality factor ("Q" or "Q-value") exhibited by available on-chip inductors. Similarly, the low Q-value exhibited by LC-tanks also limits the frequency stability attained by any FS based on their use. So, the adoption of LC-based FSs in future wireless and wired communication networks cannot represent a viable option. Therefore, a new passive and tunable integrated resonant technology must be developed, in order to attain suitable CSFs and FSs, as well as many other tunable circuits serving different purposes in RF chains. Such a technology must simultaneously ensure a high Q factor and an unprecedented wide frequency tuning range, while being manufacturable through CMOS-compatible fabrication processes.

SUMMARY

The present technology relates to acoustic resonators and more particularly to piezoelectric acoustic metamaterial resonators.

Provided herein are "piezoelectric acoustic metamaterial resonators" or "piezoelectric resonant acoustic metamaterials" (pRAMs) for providing a CMOS-compatible acoustic resonator technology exhibiting high Q and a wide tuning range.

In one aspect, a piezoelectric acoustic metamaterial resonator is provided. The piezoelectric acoustic metamaterial resonator includes a piezoelectric substrate having a top surface and a bottom surface. The piezoelectric acoustic metamaterial resonator also includes a plurality of magnetostrictive members disposed on the top surface of the piezoelectric substrate and extending along a length of the piezoelectric substrate and spaced across a width of the piezoelectric substrate.

In some embodiments, each of the magnetostrictive members includes a coil set which, when energized, produces a magnetic field that affects a mechanical property of the magnetostrictive members. In some embodiments, the coil set for each magnetostrictive member is disposed on a top surface of the magnetostrictive member. In some embodiments, the coil set for each magnetostrictive member is configured to be energized with a DC current to change the Young's modulus of the magnetostrictive member. In some embodiments, the piezoelectric acoustic metamaterial resonator also includes a coil set including a coil proximate to but physically separated from each magnetostrictive member which, when energized, produces a magnetic field that affects a mechanical property of at least one of the magnetostrictive members. In some embodiments, the coil set is included in a chip package containing the piezoelectric acoustic metamaterial resonator.

In some embodiments, the piezoelectric acoustic metamaterial resonator also includes, at each of the magnetostrictive members, a first electrode, having a first polarity, disposed between a corresponding one of the magnetostrictive members and the top surface of the piezoelectric substrate. In some embodiments, the piezoelectric acoustic metamaterial resonator also includes, at each of the magnetostrictive members, a second electrode, having a second polarity, opposite the first polarity, disposed on the bottom surface of the piezoelectric substrate opposite the first electrode. In some embodiments, the polarity of the first electrode of each successive magnetostrictive member of the plurality of magnetostrictive members alternates between positive and negative when an AC voltage is applied across each of the first and second electrodes.

In some embodiments, the piezoelectric substrate includes a piezoelectric nanoplate. In some embodiments, the piezoelectric substrate includes a piezoelectric material selected from the group consisting of aluminum nitride (AlN), aluminum scandium nitride (AlScN), lithium niobate ($LiNbO_3$), barium strontium titanate (BST), lead zirconate titanate (PZT), zinc oxide (ZnO), gallium nitride (GaN), Lithium tantalate ($LiTaO_3$), magnesium zirconium-doped aluminum nitride (MgZrAlN), or combinations thereof. In some embodiments, the plurality of magnetostrictive members comprise thin sputtered iron gallium boron (FeGaB) films. In some embodiments, the first and second electrodes include aluminum. In some embodiments, each coil set also includes a coil. In some embodiments, each coil set also includes an electrically insulating layer interposed between the coil and the top surface of the magnetostrictive member. In some embodiments, the coil includes a metal, such as nickel (Ni), or a metal alloy. In some embodiments, the electrically insulating layer includes silicon dioxide ($SiO_2$).

In some embodiments, the piezoelectric acoustic metamaterial resonator also includes a plurality of periodic cells, each including a first region extending along a width of each of the magnetostrictive members. In some embodiments, the piezoelectric acoustic metamaterial resonator also includes a plurality of periodic cells, each including a second region extending along the width of the spacing between two of the magnetostrictive members. In some embodiments, the piezoelectric acoustic metamaterial resonator is configured to generate bandgaps in the first region responsive to the application of the AC voltage across each of the first and second electrodes simultaneous with energizing a coil of the magnetostrictive member with a DC current to change a mechanical property of the magnetostrictive member, the bandgaps preventing the first region from guiding energy between adjacent periodic cells to acoustically isolate the second region of the periodic cell from the adjacent periodic cells. In some embodiments, the piezoelectric acoustic metamaterial resonator is configured to generate standing acoustic waves in the second region responsive to the application of the AC voltage across each of the first and second electrodes simultaneous with energizing a coil of the magnetostrictive member with a DC current to change a mechanical property of the magnetostrictive member. In some embodiments, a resonant frequency of the standing acoustic waves is: $f_{res} = n \cdot c(mod)/(W(a)+n \cdot \delta)$, wherein n is a mode order of the standing waves, W(a) is a width of the second region, and $\delta$ a penetration depth for a displacement field relative to the A0 mode in the first region.

In a second aspect, a piezoelectric acoustic metamaterial resonator is provided. The piezoelectric acoustic metamaterial resonator includes a piezoelectric substrate having a top surface and a bottom surface. The piezoelectric acoustic metamaterial resonator also includes a plurality of magnetostrictive members disposed on the top surface of the piezoelectric substrate and extending along a length of the piezoelectric substrate and spaced across a width of the piezoelectric substrate. The piezoelectric acoustic metamaterial resonator also includes each magnetostrictive member having a coil set disposed on a top surface thereof. Each coil set includes a coil which is configured to be energized with a DC current to change the Young's modulus of the magnetostrictive member. Each coil set also includes an electrically insulating layer interposed between the coil and the top surface of the magnetostrictive member. The piezoelectric acoustic metamaterial resonator also includes, at each of the magnetostrictive members, a first electrode, having a first polarity, disposed between a corresponding one of the magnetostrictive members and the top surface of the piezoelectric substrate. The piezoelectric acoustic metamaterial resonator also includes, at each of the magnetostrictive members, a second electrode, having a second polarity, opposite the first polarity, disposed on the bottom surface of the piezoelectric substrate opposite the first electrode. The first electrode includes wherein the polarity of the first electrode of each successive magnetostrictive member of the plurality of magnetostrictive members alternates between positive and negative when an AC voltage is applied across each of the first and second electrodes.

In some embodiments, the piezoelectric substrate comprises at least one of an aluminum nitride (AlN) nanoplate an aluminum scandium nitride (AlScN) nanoplate. In some embodiments, the plurality of magnetostrictive members comprise thin sputtered iron gallium boron (FeGaB) films. In some embodiments, the chip set comprises an on-chip coil including the coil comprising nickel (Ni) and the electrically insulating layer comprising silicon dioxide ($SiO_2$). In some embodiments, the first and second electrodes comprise aluminum (Al) interdigitated metal electrodes.

In a third aspect a method for tuning a piezoelectric acoustic metamaterial resonator is provided. The method includes applying an AC voltage across each of a plurality of first and second electrodes, the first electrode having a first polarity and being disposed between a corresponding one of a magnetostrictive members and a top surface of a piezoelectric substrate on which the magnetostrictive members are disposed and the second electrode having a second polarity, opposite the first polarity and being disposed on a bottom surface of the piezoelectric substrate opposite the first electrode, wherein a polarity of the first electrode of each successive magnetostrictive member of the plurality of magnetostrictive members alternates between positive and negative. The method also includes energizing, for at least one of the magnetostrictive members, a coil of a coil set disposed on a top surface thereof to produce a magnetic field to alter a mechanical property of the corresponding magnetostrictive member, wherein each of the magnetostrictive members includes one of the coil sets.

In some embodiments, the step of energizing further comprises applying a DC current to the coil to change the Young's modulus of the magnetostrictive member. In some embodiments, the method also includes adjusting the DC voltage to alter the magnetic field to change an acoustic property of the piezoelectric acoustic metamaterial resonator. In some embodiments, the acoustic property is a resonance frequency of the piezoelectric acoustic metamaterial resonator. In some embodiments, the piezoelectric acoustic metamaterial resonator includes any piezoelectric acoustic metamaterial resonator described herein.

In a fourth aspect, a channel-select-filter is provided. The channel-select-filter includes a two-port network. The channel-select-filter also includes a plurality of electrically coupled piezoelectric acoustic metamaterial resonators integrated into the two-port network. Each piezoelectric acoustic metamaterial resonator includes a piezoelectric substrate having a top surface and a bottom surface. Each piezoelectric acoustic metamaterial resonator also includes a plurality of magnetostrictive members disposed on the top surface of the piezoelectric substrate and extending along a length of the piezoelectric substrate and spaced across a width of the piezoelectric substrate.

In some embodiments, the plurality of electrically coupled piezoelectric acoustic metamaterial resonators further comprises two pair of electrically coupled piezoelectric acoustic metamaterial resonators configured to provide a fourth order filter. In some embodiments, the plurality of electrically coupled piezoelectric acoustic metamaterial resonators each includes any piezoelectric acoustic metamaterial resonator described herein. In some embodiments, the channel-select-filter is integrated within a low-power radio. In some embodiments, the channel-select-filter is integrated within a Bluetooth-Low-Energy beacon. In some embodiments, the channel-select-filter is integrated within a software-defined radio.

In a fifth aspect, a tunable frequency generator is provided. The tunable frequency generator includes a current-controlled oscillator. The current-controlled oscillator includes a piezoelectric acoustic metamaterial resonator. The piezoelectric acoustic metamaterial resonator includes a piezoelectric substrate having a top surface and a bottom surface. The piezoelectric acoustic metamaterial resonator also includes a plurality of magnetostrictive members disposed on the top surface of the piezoelectric substrate and extending along a length of the piezoelectric substrate and spaced across a width of the piezoelectric substrate. The tunable frequency generator also includes an analog phase-locked loop. The analog phase-locked loop includes the current-controlled oscillator. The analog phase-locked loop also includes a phase-frequency detector. The analog phase-locked loop also includes a loop filter. The analog phase-locked loop also includes a programmable frequency divider. The tunable frequency generator also includes a low-frequency temperature compensated crystal oscillator in electrical communication with the analog phase-locked loop, the analog phase-locked loop being driven by a stable output of the low-frequency temperature compensated crystal oscillator.

In some embodiments, the piezoelectric acoustic metamaterial resonator includes any piezoelectric acoustic metamaterial resonator described herein. In some embodiments, the piezoelectric acoustic metamaterial resonator is controlled by a DC current composed of a sum of a DC biasing current configured to set an output frequency of the tunable frequency generator and a time-varying control-current output by the loop filter and proportional to the output voltage of the programmable frequency divider. In some embodiments, the DC biasing current is from zero (0) to 45 µA. In some embodiments, the output frequency of the tunable frequency generator is from 300 MHz to 30 GHz. In some embodiments, the output frequency of the tunable frequency generator is from 1.35 GHz to 1.85 GHz. In some embodiments, the tunable frequency generator is integrated into at least one of a fourth-generation (4G) radio, a fifth-generation (5G) radio, or a a sixth-generation (6G) radio.

The present technology can be further summarized by the following list of embodiments.

1. A piezoelectric acoustic metamaterial resonator, comprising:
   a piezoelectric substrate having a top surface and a bottom surface; and
   a plurality of magnetostrictive members disposed on the top surface of the piezoelectric substrate and extending along a length of the piezoelectric substrate and spaced across a width of the piezoelectric substrate.
2. The piezoelectric acoustic metamaterial resonator of embodiment 1, wherein each of the magnetostrictive members includes a coil set which, when energized, produces a magnetic field that affects a mechanical property of the magnetostrictive members.
3. The piezoelectric acoustic metamaterial resonator of any of the preceding embodiments wherein the coil set for each magnetostrictive member is disposed on a top surface of the magnetostrictive member.
4. The piezoelectric acoustic metamaterial resonator of any of the preceding embodiments wherein the coil set for each magnetostrictive member is configured to be energized with a DC current to change the Young's modulus of the magnetostrictive member.
5. The piezoelectric acoustic metamaterial resonator of embodiment 1, further comprising a coil set including a coil proximate to but physically separated from each magnetostrictive member which, when energized, produces a magnetic field that affects a mechanical property of at least one of the magnetostrictive members.
6. The piezoelectric acoustic metamaterial resonator of any of embodiments 1 or 5 wherein the coil set is included in a chip package containing the piezoelectric acoustic metamaterial resonator.
7. The piezoelectric acoustic metamaterial resonator of any of the preceding embodiments further including, at each of the magnetostrictive members:

a first electrode, having a first polarity, disposed between a corresponding one of the magnetostrictive members and the top surface of the piezoelectric substrate; and a second electrode, having a second polarity, opposite the first polarity, disposed on the bottom surface of the piezoelectric substrate opposite the first electrode.

8. The piezoelectric acoustic metamaterial resonator of embodiment 7 wherein the polarity of the first electrode of each successive magnetostrictive member of the plurality of magnetostrictive members alternates between positive and negative when an AC voltage is applied across each of the first and second electrodes.

9. The piezoelectric acoustic metamaterial resonator of any of the preceding embodiments, wherein the piezoelectric substrate comprises a piezoelectric nanoplate.

10. The piezoelectric acoustic metamaterial resonator of any of the preceding embodiments, wherein the piezoelectric substrate comprises a piezoelectric material selected from the group consisting of aluminum nitride (AlN), aluminum scandium nitride (AlScN), lithium niobate (LiNbO$_3$), barium strontium titanate (BST), lead zirconate titanate (PZT), zinc oxide (ZnO), gallium nitride (GaN), Lithium tantalate (LiTaO$_3$), magnesium zirconium-doped aluminum nitride (MgZrAlN), or combinations thereof.

11. The piezoelectric acoustic metamaterial resonator of any of the preceding embodiments, wherein the plurality of magnetostrictive members comprise thin sputtered iron gallium boron (FeGaB) films.

12. The piezoelectric acoustic metamaterial resonator of embodiment 7, wherein the first and second electrodes comprise aluminum.

13. The piezoelectric acoustic metamaterial resonator of any of embodiments 2-6, wherein each coil set further comprises:
    a coil; and
    an electrically insulating layer interposed between the coil and the top surface of the magnetostrictive member.

14. The piezoelectric acoustic metamaterial resonator of embodiment 13, wherein the coil comprises a metal, such as nickel (Ni), or a metal alloy.

15. The piezoelectric acoustic metamaterial resonator of any of embodiments 13-14, wherein the electrically insulating layer comprises silicon dioxide (SiO$_2$).

16. The piezoelectric acoustic metamaterial resonator of any of the preceding embodiments, further comprising a plurality of periodic cells, each including:
    a first region extending along a width of each of the magnetostrictive members; and
    a second region extending along the width of the spacing between two of the magnetostrictive members.

17. The piezoelectric acoustic metamaterial resonator of embodiment 16, the piezoelectric acoustic metamaterial resonator configured to generate bandgaps in the first region responsive to the application of the AC voltage across each of the first and second electrodes simultaneous with energizing a coil of the magnetostrictive member with a DC current to change a mechanical property of the magnetostrictive member, the bandgaps preventing the first region from guiding energy between adjacent periodic cells to acoustically isolate the second region of the periodic cell from the adjacent periodic cells.

18. The piezoelectric acoustic metamaterial resonator of any of embodiments 16-17, the piezoelectric acoustic metamaterial resonator configured to generate standing acoustic waves in the second region responsive to the application of the AC voltage across each of the first and second electrodes simultaneous with energizing a coil of the magnetostrictive member with a DC current to change a mechanical property of the magnetostrictive member.

19. The piezoelectric acoustic metamaterial resonator of embodiment 18, wherein a resonant frequency of the standing acoustic waves is: $f_{res}=n \cdot c(mod)/(W(a)+n \cdot \delta)$, wherein n is a mode order of the standing waves, W(a) is a width of the second region, and $\delta$ a penetration depth for a displacement field relative to the A0 mode in the first region.

20. A piezoelectric acoustic metamaterial resonator comprising:
    a piezoelectric substrate having a top surface and a bottom surface;
    a plurality of magnetostrictive members disposed on the top surface of the piezoelectric substrate and extending along a length of the piezoelectric substrate and spaced across a width of the piezoelectric substrate;
    each magnetostrictive member having a coil set disposed on a top surface thereof and including:
        a coil which is configured to be energized with a DC current to change the Young's modulus of the magnetostrictive member, and
        an electrically insulating layer interposed between the coil and the top surface of the magnetostrictive member; and
    at each of the magnetostrictive members:
        a first electrode, having a first polarity, disposed between a corresponding one of the magnetostrictive members and the top surface of the piezoelectric substrate, and
        a second electrode, having a second polarity, opposite the first polarity, disposed on the bottom surface of the piezoelectric substrate opposite the first electrode,
    wherein the polarity of the first electrode of each successive magnetostrictive member of the plurality of magnetostrictive members alternates between positive and negative when an AC voltage is applied across each of the first and second electrodes.

21. The piezoelectric acoustic metamaterial resonator of embodiment 20, wherein:
    the piezoelectric substrate comprises at least one of an aluminum nitride (AlN) nanoplate an aluminum scandium nitride (AlScN) nanoplate;
    the plurality of magnetostrictive members comprise thin sputtered iron gallium boron (FeGaB) films;
    the chip set comprises an on-chip coil including the coil comprising nickel (Ni) and the electrically insulating layer comprising silicon dioxide (SiO$_2$); and
    the first and second electrodes comprise aluminum (Al) interdigitated metal electrodes.

22. A method for tuning a piezoelectric acoustic metamaterial resonator, comprising:
    applying an AC voltage across each of a plurality of first and second electrodes, the first electrode having a first polarity and being disposed between a corresponding one of a magnetostrictive members and a top surface of a piezoelectric substrate on which the magnetostrictive members are disposed and the second electrode having a second polarity, opposite the first polarity and being disposed on a bottom surface of the piezoelectric substrate opposite the first electrode, wherein a polarity of the first electrode of each successive magnetostrictive member of the plurality of magnetostrictive members alternates between positive and negative; and
    energizing, for at least one of the magnetostrictive members, a coil of a coil set disposed on a top surface thereof to produce a magnetic field to alter a mechanical property of the corresponding magnetostrictive member, wherein each of the magnetostrictive members includes one of the coil sets.

23. The method of embodiment 22, wherein the step of energizing further comprises applying a DC current to the coil to change the Young's modulus of the magnetostrictive member.

24. The method of embodiment 23, further comprising adjusting the DC voltage to alter the magnetic field to change an acoustic property of the piezoelectric acoustic metamaterial resonator.

25. The method of embodiment 24, wherein the acoustic property is a resonance frequency of the piezoelectric acoustic metamaterial resonator.

26. The method of embodiment 22, wherein the piezoelectric acoustic metamaterial resonator includes the piezoelectric acoustic metamaterial resonator of any of embodiments 1-21.

27. A channel-select-filter comprising:
a two-port network; and
a plurality of electrically coupled piezoelectric acoustic metamaterial resonators integrated into the two-port network, each piezoelectric acoustic metamaterial resonator including:
a piezoelectric substrate having a top surface and a bottom surface, and
a plurality of magnetostrictive members disposed on the top surface of the piezoelectric substrate and extending along a length of the piezoelectric substrate and spaced across a width of the piezoelectric substrate.

28. The channel-select-filter of embodiment 27, wherein the plurality of electrically coupled piezoelectric acoustic metamaterial resonators further comprises two pair of electrically coupled piezoelectric acoustic metamaterial resonators configured to provide a fourth order filter.

29. The channel-select-filter of any of embodiments 27-28, wherein the plurality of electrically coupled piezoelectric acoustic metamaterial resonators each includes the piezoelectric acoustic metamaterial resonator of any of embodiments 1-21.

30. The channel-select-filter of any of embodiments 27-29, wherein the channel-select-filter is integrated within a low-power radio.

31. The channel-select-filter of any of embodiments 27-29 wherein the channel-select-filter is integrated within a Bluetooth-Low-Energy beacon.

32. The channel-select-filter of any of embodiments 27-29, wherein the channel-select-filter is integrated within a software-defined radio.

33. A tunable frequency generator comprising:
a current-controlled oscillator including:
a piezoelectric acoustic metamaterial resonator having:
a piezoelectric substrate having a top surface and a bottom surface, and
a plurality of magnetostrictive members disposed on the top surface of the piezoelectric substrate and extending along a length of the piezoelectric substrate and spaced across a width of the piezoelectric substrate;
an analog phase-locked loop including:
the current-controlled oscillator,
a phase-frequency detector,
a loop filter, and
a programmable frequency divider; and
a low-frequency temperature compensated crystal oscillator in electrical communication with the analog phase-locked loop, the analog phase-locked loop being driven by a stable output of the low-frequency temperature compensated crystal oscillator.

34. The tunable frequency generator of embodiment 33, wherein the piezoelectric acoustic metamaterial resonator includes the piezoelectric acoustic metamaterial resonator of any of embodiments 1-21.

35. The tunable frequency generator of any of embodiments 33-34, wherein the piezoelectric acoustic metamaterial resonator is controlled by a DC current composed of a sum of:
a DC biasing current configured to set an output frequency of the tunable frequency generator; and
a time-varying control-current output by the loop filter and proportional to the output voltage of the programmable frequency divider.

36. The tunable frequency generator of embodiment 35, wherein the DC biasing current is from zero (0) to 45 µA.

37. The tunable frequency generator of any of embodiments 35-36, wherein the output frequency of the tunable frequency generator is from 300 MHz to 30 GHz.

38. The tunable frequency generator of any of embodiments 35-37, wherein the output frequency of the tunable frequency generator is from 1.35 GHz to 1.85 GHz.

39. The tunable frequency generator of any of embodiments 33-38, wherein the tunable frequency generator is integrated into at least one of a fourth-generation (4G) radio, a fifth-generation (5G) radio, or a a sixth-generation (6G) radio.

BRIEF DESCRIPTION OF THE DRAWINGS

FIG. 13 is a chart comparing the size and functionalities of magnetometers using the pRAM of FIG. 1A to various types of prior art magnetometers.

DETAILED DESCRIPTION

Figure 1A:
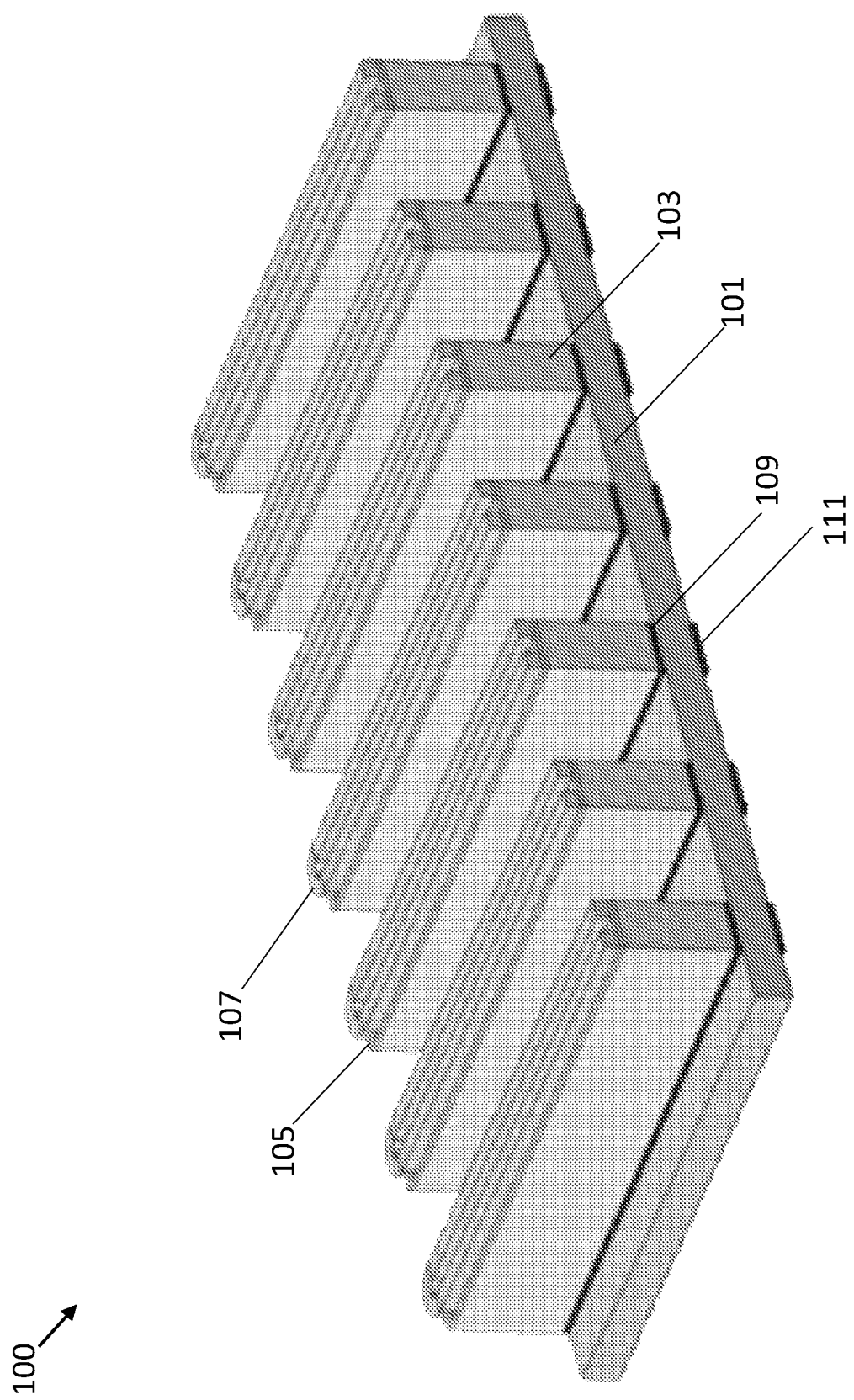
FIG. 1A is a perspective view of a piezoelectric acoustic metamaterial resonator ("pRAM") in accordance with various embodiments.

Tunable bandpass/notch filters and wide tuning range low-jitter Voltage Controlled Oscillators (VCOs) are desirable to form adaptive, low-power and miniaturized multi-band radios. Piezoelectric acoustic resonators have been used to form (1-5 GHz) CMOS-compatible filters and VCOs. However, because of material limitations, these devices only enable a low tuning range (<2-3%) and moderate Q-values (~2000). Here, acoustic resonant metamaterials (pRAMs), using CMOS-compatible magnetostrictive layers, are proposed to break this paradigm, thus enabling RF resonators achieving Q>14000, resistance lower than 1Ω, a wide tuning range (>30%) and a power consumption, to achieve the tuning, lower than 3 μW. pRAMs leverage, for the first time, extraordinary wave field characteristics attained by unexplored piezoelectric acoustic metamaterials.

The present technology provides a new class of tunable low-power high-Q CMOS-compatible RF resonators. These devices, which we label as "piezoelectric Acoustic Metamaterial Resonators" or "Piezoelectric Resonant Acoustic Metamaterials" ("pRAMs") surpass, by orders of magnitude, the intrinsic material limitations that, in the past, have prevented the creation of a CMOS-compatible acoustic resonator technology exhibiting high Q and a wide tuning range. In order to do so, pRAMs leverage, for the first time, extraordinary wave field characteristics attained by unexplored piezoelectric acoustic metamaterials. The acoustic standing waves in pRAMs are originated from the interaction of Lamb waves with the highly dispersive properties exhibited by a periodic sub-wavelength arrangement of locally resonant magnetostrictive rods (or "magnetostrictive members"). A set of metallic integrated coils, crossed by a DC-current (IDC), is included in the body of pRAMs in order to generate a controllable magnetic flux (B) that can tune the mechanical properties exhibited by the magnetostrictive rods. For example, in some embodiments, the rods are made of thin sputtered FeGaB films, deposited on the top side of a suspended Aluminum Nitride (AlN) nanoplate and the coils are nickel (Ni).

However, it will be apparent in view of this disclosure that a substrate of any piezoelectric material having magnetostrictive rods/members of any magnetostrictive material formed thereon can be used in accordance with various embodiments to produce pRAMs as disclosed herein. For example, piezoelectric substrates can include aluminum nitride (AlN), aluminum scandium nitride (AlScN), lithium niobate (LiNbO$_3$), barium strontium titanate (BST), lead zirconate titanate (PZT), zinc oxide (ZnO), gallium nitride (GaN), Lithium tantalate (LiTaO$_3$), magnesium zirconium-doped aluminum nitride (MgZrAlN), combinations thereof, or any other suitable piezoelectric material. Similarly, for example, magnetostrictive materials can include nickel and alloys such as iron-aluminum (Fe—Al or "Alfer"), iron-nickel (Fe—Ni or "Permalloy"), cobalt-nickel (Co—Ni), iron-cobalt (Fe—Co), and cobalt-iron-vanadium (Co—Fe—V or "Permendur"), many ferrites (e.g., CoFe$_2$O$_4$ and NiFe$_2$O$_4$), combinations thereof, and any other suitable magnetostrictive material.

Further, it will be apparent in view of this disclosure that, although described herein as being nickel, metallic coils can also be constructed of any suitable metallic material, such as, for example, iron, copper, aluminum, steel, brass, combinations thereof, or any other suitable metallic coil material. Additionally, although the metallic coils are shown and described herein as being integrated with the magnetostrictive members/rods, it will be apparent in view of this disclosure that any coil sufficiently proximate to a respective one of the magnetostrictive members to alter its mechanical properties can be used in accordance with various embodiments. This can include physically separated coils and/or coils formed on proximate structures. For example, in some embodiments, the coils may be formed on a chip package in which the pRAM is contained or integrated.

In this regard, the magnetostrictive behavior of the rods, pRAMs operating at Ultra- and Super-High-Frequencies ("UHF"/"SHF"), about 300 MHz to about 30 GHz, pRAMs exhibit a record-high frequency tuning range of greater than 30% and a minimum resistance lower than 1Ω, while only consuming 3 μW or less DC-power to achieve the tuning. Such dramatic improvements in pRAM characteristics over the prior art make pRAMs ideal candidates to achieve reconfigurable devices and systems for next-generation low-power RF transceivers. Ultimately, as pRAMs have the unique feature of storing the majority of the acoustic energy far from the metals and the magnetostrictive rods, they can rely on thicker and low resistivity electrodes to suppress the impact of the electrical loading on Q while causing only negligible Q-degradations due to thermoelastic dissipations. For this reason, pRAMs exhibiting record high-Q values (potentially exceeding 16000, depending on the electrode materials used) are expected even when they are designed with a large input capacitance to minimize the insertion-loss and power consumption of filters and oscillators based on their use. Such ability to overcome the severe impact of the electrical loading on Q, without introducing significant mechanical dissipations, can, for example, be used to implement CMOS-compatible RF acoustic-based devices for frequencies of operation up to Ka-band. Thanks to such unique performance characteristics, pRAMs are ideal candidates to form: i) tunable low insertion loss bandpass filters and matching networks; ii) CMOS-compatible ultralow phase-noise VCOs; iii) highly selective and tunable notch filters.

The acoustic standing waves in pRAMs are originated from the interaction of Lamb waves with the highly dispersive properties exhibited by a periodic sub-wavelength arrangement of locally resonant magnetostrictive rods. These rods can be made, for example, of thin sputtered films (e.g., FeGaB, Fe—Al or "Alfer", Fe—Ni or "Permalloy", Co—Ni, Fe—Co, and Co—Fe—V or "Permendur", ferrites (e.g., $CoFe_2O_4$ and $NiFe_2O_4$), combinations thereof, and any other suitable magnetostrictive material) deposited on the top side of a suspended piezoelectric substrate (e.g., AlN, AlScN, $LiNbO_3$, BST, PZT, ZnO, GaN, $LiTaO_3$, MgZrAlN, combinations thereof, or any other suitable piezoelectric material). Additionally, as noted above, a set of metallic coils, crossed by a DC-current (IDC), can be included in the body of pRAMs or proximate the magnetostrictive members/rods in order to generate a controllable magnetic flux (B) that can tune the mechanical properties exhibited by the magnetostrictive rods and, consequently, their resonance frequency.

Additionally, pRAMs have the unique feature of storing the majority of the acoustic energy far from the metals and the magnetostrictive rods. Therfore, pRAMs can rely on thicker, low-resistivity electrodes to suppress the impact of the electrical loading on Q while causing only negligible Q-degradations due to thermoelastic dissipations. For this reason, pRAMs exhibiting record high-Q values (exceeding 16000 when using aluminum to form their input electrodes) are expected even when they are designed with a large input capacitance to minimize the insertion-loss and power consumption of filters and oscillators based on their use. It is important to point out that the unprecedented ability to overcome the severe impact of the electrical loading on Q, without introducing significant mechanical dissipations, offers a new exciting path towards the achievement of CMOS-compatible RF acoustic-based devices for high frequencies of operation up to Ka-band.

Figure 1C:
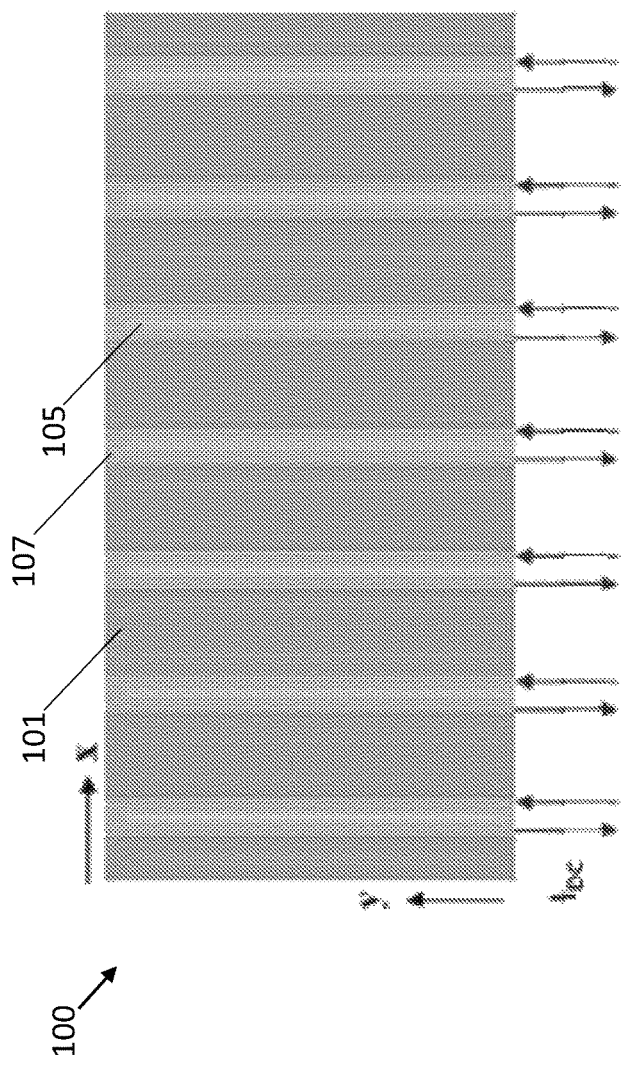
FIG. 1C is a top view of the pRAM of FIG. 1A showing a DC current flow through coils of the pRAM.

Referring now to FIG. 1A, the proposed resonator 100 is based on the adoption of a novel metamaterial structure that is formed by a periodic sub-wavelength arrangement of locally resonant magnetostrictive thin rods 103 (also referred to as "members") placed on the top side of a thin piezoelectric film substrate 101. The piezoelectric substrate 101 is sandwiched by two interdigitated metal electrodes (IDTs) 109, 111. Referring now to FIG. 1C, a set of coils 107, crossed by a DC-current (IDC), can be deposited on the top surface of the rods 103 to produce the magnetic flux (B) that changes the Young's modulus of the rods 103. The coils 107 are generally included in the body of the pRAM but can be electrically isolated from the magnetostrictive rods by a thin electrically insulating layer 105 (e.g., SiO2). The magnetically-induced change of the mechanical properties of the magnetostrictive rods 103 is then tunable by a variation of the penetration depth exhibited by the antisymmetric waves incident towards each rod 103. As a result, an equivalent change of the electrically tunable frequency-setting dimension ("W") will be produced, thus leading to a significant resonance frequency shift. This shift is two orders of magnitude larger than the one attained by exploiting the use of FeGaB to vary the effective sound velocity (c) of piezoelectric acoustic devices through a magnetostrictively induced change ($\Delta E$) of their Young's modulus (F).

In addition, because the electrical tuning of W can be attained while storing only a negligible amount of acoustic energy in the IDTs 109, 111 and the rods 103, pRAMs will not suffer from the Q-degradations that, instead, have heavily lowered the performance of previous piezoelectric acoustic devices embodying soft ferromagnetic materials.

Figure 1B:
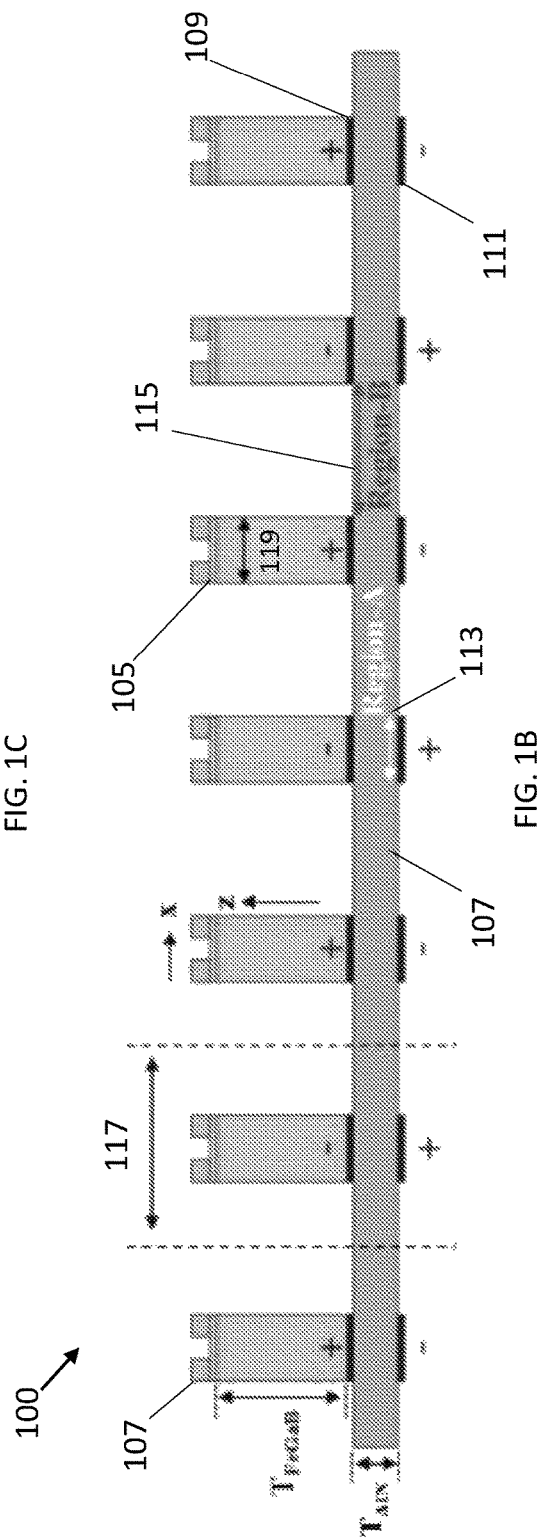
FIG. 1B is a front cross-section view of the pRAM of FIG. 1A.

Referring now to FIG. 1B, adjacent metal strips forming the top and bottom IDTs 109, 111 are connected to opposite voltage polarities so that a large electric field, E, can be excited in the thickness of the substrate 101. Each periodic cell 117 forming a pRAM is formed by two sets of different regions, which will be labeled, from now on, as "Regions-A" 113 and "Regions-B" 115. The use of the periodic rods 103 produces a phenomenon of hybridization that can deeply modify the dispersion characteristics of the Lamb modes describing the in-plane propagation of acoustic waves in the piezoelectric substrate 101. The largest change in the propagation characteristics affects the transverse Lamb modes and, most specifically for thin substrates, the A0 mode. This is mainly determined by the fact that the A0 mode exhibits a significant displacement component along the main direction of motion for the rods. Consequently, this mode can now exhibit orders of magnitude larger or lower phase velocity values than possible without the metamaterial structure. In addition, because of the interaction between incident and scattered fields generated by each resonant unit, the A0 mode will start exhibiting propagation bandgaps that do not exist when only the piezoelectric substrate is used. The generation of such bandgaps, which is originated from the high coupling between magnetostrictive rods and piezoelectric substrate, makes the substrate regions underneath each rod unable to guide energy between adjacent periodic cells. Such inability is physically originated by the transformed dispersion characteristics relative to such regions, which make k complex and evanescent within the stop-band. Consequently, as a first order of approximation, Regions-A behave as mechanical fixed boundaries placed at the edges of Regions-B, thus acoustically isolating each of them from the adjacent ones.

Because of the piezoelectric effect, a significant electric field, E, will be generated, in the AlN-film, by the application of an alternated (AC) voltage between the top and bottom IDTs. In particular, thanks to the d15 piezoelectric coefficient of AlN coupled to the lateral fringing components of E, such electric field will generate a series of standing A0 waves in Regions-B. Such acoustic waves will then be confined between adjacent Regions-A, thus forming the equivalent of lithographically defined bulk-acoustic Fabry Perot cavities, bounded between two acoustic mirrors. The resonance frequency of the excited waves can be found as: $f_{res}=n \cdot c(mod)/(W(a)+n \cdot \delta)$, with n being the mode order, W(a) the width of Regions-B and $\delta$ the penetration depth for the displacement field relative to the A0 mode in Regions-A. It is important to point out that $\delta$ is inversely proportional to the imaginary part of k, whose sensitivity with respect to frequency can be extremely large. Also, almost all the acoustic energy produced by the excitation of such resonant mode is stored in Regions-B. This feature is of fundamental importance. In fact, by preventing the acoustic energy from reaching the IDTs, the rods and the tuning coils, it is possible to completely evade any acoustic dissipation that limits, instead, the mechanical quality factor of high frequency BAW and SAW devices. Moreover, this feature permits to have an additional degree of freedom on the selection of the IDTs material and geometry. In fact, as the IDTs are not reached by mechanical vibration, they can be made out of thick and low-resistivity metal layers, thus also evading dissipations originated from electrical loading.

Ultimately, as all Regions-B are geometrically bounded by device parts characterized by an evanescent wavevector for the A0 mode, acoustic dissipations due to anchor losses are also mitigated. Consequently, we expect that that the proposed pRAMs can reach record high Q-values approaching the limit set by the acoustic losses in Aluminum Nitride (>30000 for devices operating in the Super-High-Frequency range). In addition, thanks to the magnetostrictive properties of thin film FeGaB layers, the acoustic velocity (crod) relative to the z-oriented extensional displacement field in the rods can be significantly tuned proportionally to the DC-current flowing into the tuning coils, IDC. In particular, the application of B-values in excess of 10 Oe, corresponding to IDC-values in pair of 35 µA for 120 µm long pRAMs, suffices to produce a 30% decrease of crod. Such decrease determines a shift in the resonance frequency relative to the thickness-extensional (TE(rod)) mode of vibration of the rod. As a result, modified coupling conditions occur between TE(rod) and the A0 mode. Such a change leads to a variation of δ and fres. In other words, the ability to control c(rod) permits to electronically vary the distance between the equivalent mirrors confining the vibration in Regions-B. It is worth mentioning that this unexplored tuning method leads to an unprecedented sensitivity of fres vs. B that is two orders of magnitude higher than attained by state-of-the-art magnetometers based on AlN nano acoustic resonant devices embodying FeGaB layers (0.2 MHz/Oe).

The device described herein represents the first prototype of a piezoelectric resonator based on an acoustic metamaterial structure. It uses the metamaterial structure to surpass the intrinsic material limitations that have prevented the use of acoustic devices for tunable, low-loss and low-power RF applications. The use of FeGaB-rods enables the tuning of the metamaterial structure through the use of a DC-current flowing in integrated coils and producing a magnetic flux that varies the mechanical properties of the rods and, consequently, their frequency of operation. The device described herein exhibits a modal displacement profile that allows to confine the acoustic energy far from the electrodes. As a result, it is possible to suppress any mechanical dissipation that electrodes produce. Moreover, as the electrodes do not add significant mechanical losses, they can be made thicker in favor of lower electrical loading. As a result, pRAMs can achieve unprecedented Q-values that approaches closely the limit set by the AlN-film (>30000). The current Idc varies the effective length of the resonant cavity, thus introducing a change in resonance frequency that is much higher than attainable by conventional tuning methods only based on changes in Young's modulus of the active resonator portion to operate.

The fundamental physics of the device not only opens up to new classes of reconfigurable RF-components but also enables a new technique to achieve tunable resonant sensors with unprecedented sensitivities. For instance, if the proposed device were used to form a resonant magnetometer, it would exhibit a sensitivity (38 MHz-shit per Oe) that is two orders of magnitude than the one attained by resonant AlN nanoplates embodying the same magnetostrictive material (FeGaB) to operate. Similar tuning methods could be applied to achieve different classes of sensors (chemical, physical and electromagnetic). In fact, the tuning strategy based on metamaterial that is proposed can be used, in combination with different sensitive materials, to form any resonant sensor based on needs.

The pRAMs described herein enable CMOS-compatible acoustic resonators capable of achieving tuning ranges in excess of 30%. Such a wide tuning range will enable new classes of RF-components that do not exist today, such as tunable RF-filters, tunable matching networks, tunable notch-filters (for interference suppression) and tunable voltage controlled oscillators (for ultra-stable frequency synthesizers). The displacement modal characteristics of pRAMs permit to confine the acoustic energy far from the metal electrodes. So, differently from previously developed high-frequency acoustic resonators, these devices do not suffer from thermoelastic dissipations. In addition, as the metal layers do not have a significant impact on Q, thicker electrodes can be used to evade the electrical loading. So pRAMs are promising candidates to achieve Q-values that are only limited by the low intrinsic losses of the piezoelectric layer. The design criteria and theory applied to AlN pRAMs can be extended to any other piezoelectric material (PZT, Lithium Niobate, Aluminum Scandium Nitride, etc.) The design criteria and theory applied to AlN pRAMs can be extended to the design of high-sensitivity sensors, such as magnetometers, electric field sensors, physical and chemical sensors. According to the present technology pRAMs can be used to enable reconfigurable filters and matching networks in commercial and military RF front-ends. pRAMs can be used to enable ultra-stable voltage-controlled-oscillators (VCOs) exhibiting low jitter (few femto-seconds from 12 kHz to 20 MHz around the carrier), thus being suitable to form frequency synthesizers for high data-rate (>400 Gbps) communication systems. According to the present technology, pRAMs can be used to form reconfigurable notch filters capable of selectively suppress any undesired interference signal while preserving the ideal reception of useful low power information. For this reason, these devices can represent a serendipity for 4G/5G radio-modules operating within highly congested spectral scenarios. For instance, radios used by IoT devices would gain a significant benefit from the existence of such a novel tunable technology.

Additional benefits include the ability to achieve tunable notch filters that can suppress the interference signals that might occur in any radio operating within a congested spectral scenario (4G/5G and IoT systems would be the best example). It allows to achieve lithographically defined and tunable miniaturized components through a large-scale production process flow. These components could replace large and not integratable RF-passives based on dielectric or lumped LC-elements, thus leading to unprecedented degrees of miniaturization for front-ends that require significant degrees of tunability. The device described herein surpasses by orders of magnitude the intrinsic limits of previously developed acoustic resonators for RF applications. So better performance and significantly higher tunability make it a unique example to address needs that were not addressable by previously developed acoustic technologie Previously Developed Lamb Wave Resonators In the last decades, aluminum nitride (AlN) piezoelectric acoustic resonators have been widely used to form CMOS-compatible low loss wideband filters in commercial telecommunication and navigation platforms. Such devices are based on the electrical excitation of high-frequency acoustic Lamb waves in thin film AlN layers. They are generally formed by a piezoelectric plate sandwiched between two properly shaped metal layers that are needed to produce the desired motion. The placement and shape of the metal electrodes are engineered to select the desired mode of vibration, which is chosen, among the available Lamb wave plate modes, depending on the requested performance and system metrics. The resonance frequency, $f_{res}$, of any acoustic resonator can be found as c/L, being c the acoustic velocity of the excited mode and L the frequency-setting dimension. In particular, L coincides with the separation between adjacent peaks of the predominant displacement component relative to the resonator portion that stores the majority of the modal acoustic energy.

Two main classes of AlN-based acoustic resonators have been researched in the past: Surface Acoustic Wave (SAW) and Bulk Acoustic Wave (BAW) devices. SAW devices use interdigitated metal electrodes to excite acoustic surface waves in AlN plates. Because of their relatively low acoustic velocity (<5000 m/s), high-frequency SAW resonators demand stringent lithographic resolutions to be manufactured. For this reason, only SAW devices operating at frequencies that are lower than 3 GHz are suitable for large scale production. In contrast, BAW components, such as Film-Bulk-Acoustic-Resonators (FBARs [6]), are characterized by higher acoustic velocities (>10000 m/s) than the SAW counterparts. So, they can be manufactured through more relaxed lithographic resolutions, thus being ideal when resonators operating beyond 3 GHz are needed. Within their typical ranges of operational frequencies, both BAW and SAW devices have demonstrated Q-values approaching 2000 when exhibiting proper capacitance values for operation in 50Ω-matched systems. While such values are significantly higher than what is attained through the use of LC tanks, it is significantly limited by three main dissipation mechanisms: acoustic metal dissipations [4], electrical loading and anchor dissipations. Acoustic metal dissipations and electrical loading are originated from thermoelastic damping and ohmic losses, respectively, which occur in the moving metal layers that excite the resonator into motion. In contrast, anchor losses are originated from leakage of acoustic energy from the resonant body into the attached silicon substrate. The aforementioned mechanisms have a negative effect on Q that becomes even more dramatic when resonators operating at higher frequencies are needed. In the last years, a significant attention has been focused on enabling analog frequency tunability in BAW and SAW devices. In particular, two main approaches have been demonstrated. One approach uses the temperature dependence coefficient (TCE) of the AlN Young's modulus ($E_{AlN}$) to generate changes in $E_{AlN}$ and, consequently, in c ($\propto \sqrt{E_{AlN}}$), from the adoption of a closely spaced DC-biased heater. Because of the low TCE value, only limited tuning ranges (<40 ppm/K) can be attained through the use of this approach, assuming reasonable low DC power levels (<1 mW).

The second approach is based on the adoption of abrupt or hyper abrupt varactors, connected in parallel to the acoustic resonator whose frequency is to be tuned. Thanks to the piezoelectric effect, by changing the capacitance value of the adopted varactor, it is possible to vary the effective sound velocity (i.e. c) by an amount that is proportional to the piezoelectric coupling coefficient ($KT^2$) attained by the acoustic device. Since AlN SAW and BAW devices are characterized by $KT^2$-values respectively limited to 0.1% and 7%, due to material properties, the use of this tuning approach enables tuning ranges that cannot exceed the same percentages. Moreover, both the two described approaches inevitably lead to undesired and significant Q and insertion loss degradations. For this reason, only limited tuning ranges (<2%) can be practically leveraged to attain usable and tunable acoustic based components.

More recently, the use of magnetostrictive materials, and in particular of FeGaB in the body of AlN BAW resonators, has been explored in order to achieve magnetic field sensors and electrically small magnetostrictive antennas. However, while these reported devices demonstrate that it is possible to integrate thin-film sputtered FeGaB layers in the body of RF AlN acoustic resonators, the modal characteristics exploited by these previously developed AlN-based resonators prevent them from attaining large TRs and result in large Q-degradations.

Also recently, the development of metamaterials, for acoustic and elastodynamics, exhibiting negative constitutive parameters (Young's modulus or mass density) and operating at audible or near audible frequencies has been ongoing. In particular, several applications have been targeted, such as: sonic cloaking, abnormal refraction, superlensing, and noise cancelling.

Some exploration regarding the interaction of plate modes with locally resonant mechanical features has also been done. In particular, the ability to artificially create bandgaps in the dispersion characteristics exhibited by low-frequency Lamb waves has been recently studied. Also, piezoelectric locally resonant devices have been proposed to achieve a significant low-frequency attenuation, for both sound and low-frequency vibrations, and to attain efficient environmental energy harvesters. With regard to the ability to reconfigure the response of acoustic metamaterials, an active control of the negative Young's modulus has been recently proposed to achieve tunable acoustic metamaterial behaviors. Also, the use of elastic instabilities has been proposed for attaining a dynamic control of the constitutive parameters relative to designed metamaterials. Recently, the adoption of an external magnetic field has also shown potential in leveraging fast changes of both amplitude and sign of the effective Young's modulus of structurally buckled lattices. Ultimately, an electronic tuning through active or passive lumped components has also been proposed. While these previous approaches demonstrated the possibility to tune the frequency response of acoustic metamaterials, each of them continues to suffer from an inability to achieve the high TRs required for next generation applications.

Most recently, the inventors demonstrated the design, operation and performance of the first acoustic metamaterial-based RF resonator reported to date. This device, called "Two-Dimensional-Resonant-Rods" ("2DRR"), exploits the unconventional acoustic behavior exhibited by a forest of locally resonant rods. The rods of the 2DRR are built in the body of a profiled AlN layer, sandwiched between a bottom un-patterned metal plate and a top metallic grating. However, the metamaterial of 2DRRs is not tunable and is instead engineered to make 2DRRs surpass the maximum $kt^2$-value that Lamb wave resonators can attain. In that regard, a 2.4 GHz 2DRR showing a record-high $kt^2$, exceeding 7.4%, was demonstrated thus being higher than what was ever possible to achieve in AlN Lamb wave devices. 2DRRs exhibit propagation characteristics that make them able to attain wideband and CMOS-compatible AlN DLs, with bandwidth-delay-products (BDPs) exceeding 2. The achievement of such high BDPs opens unexplored scenarios in the future development of integrated self-interference cancellation networks. These 2DRR-based self-interference cancellation networks, however, have substantially different functionalities and applications than the piezoelectric acoustic metamaterial resonators provided herein. In particular, the role of 2DRR will likely be in full-duplex radios, for mm-wave communication, imaging, and sensing applications.

Principle of Operation

The proposed resonator is based on the adoption of a novel metamaterial structure that is formed by a periodic sub-wavelength arrangement of locally resonant magnetostrictive thin rods placed on the top side of a piezoelectric substrate. The substrate is sandwiched by two interdigitated metal electrodes (IDTs). Also, a set of coils, crossed by a DC-current (IDC), are deposited on the top surface of the rods to produce the magnetic flux (B) that changes their Young's modulus. Adjacent metal strips forming the top and bottom IDTs are connected to opposite voltage polarities so that a large electric field, E, can be excited in the thickness ($T_{AlN}$) of the piezoelectric substrate. FIG. 1B illustrates a cross-sectional representation of apRAM. Each periodic cell 117 is formed by two sets of different regions, which will be labeled, from now on, as "Regions-A" 113 and "Regions-B" 115.

Figure 3:
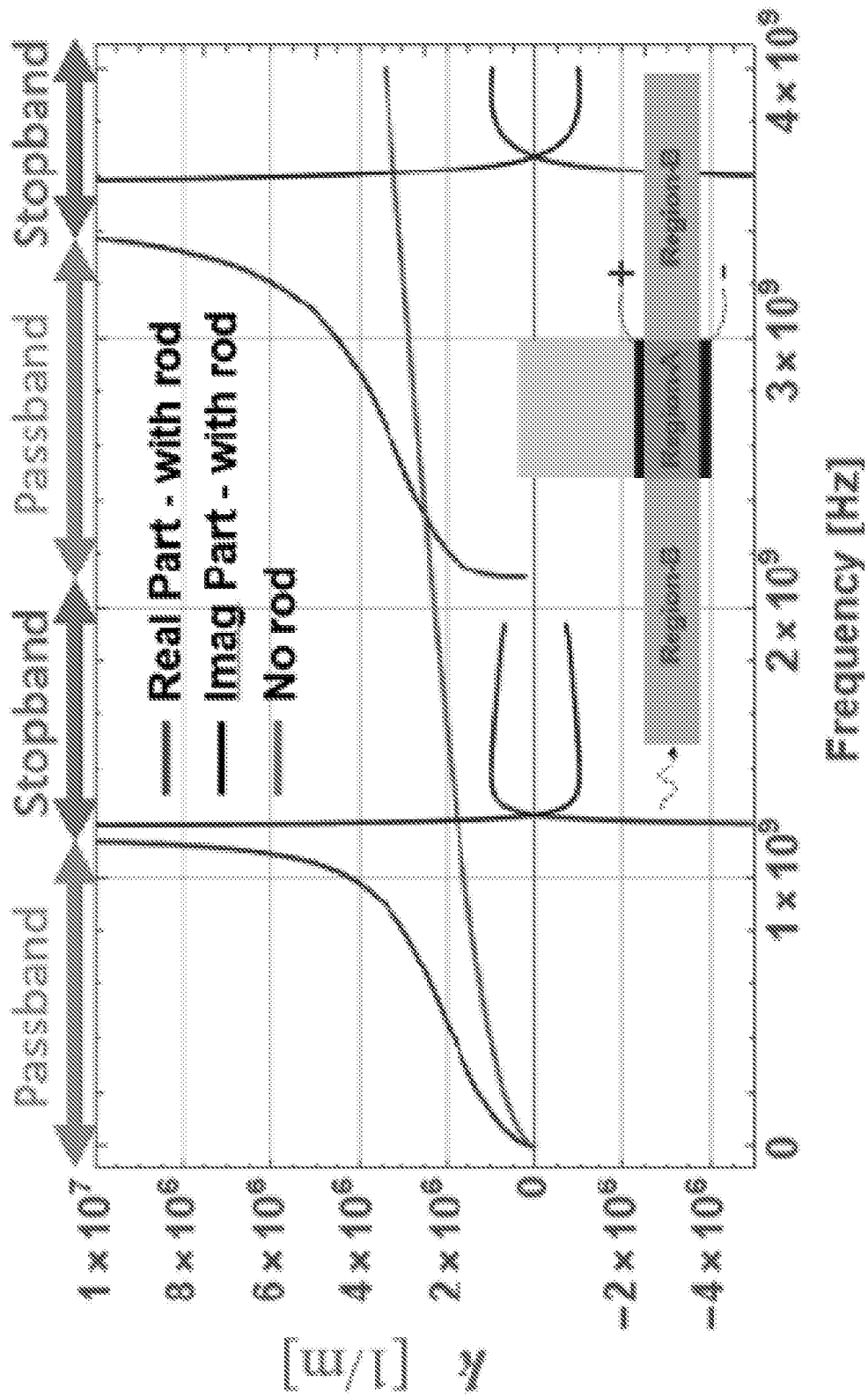
FIG. 3 is a graphical plot illustrating a wavevector ("k") vs. frequency for an A0 mode of a pRAM compared to wavevector vs. frequency of an A0 mode of an AlN nanoplate.

The use of the periodic rods produces a phenomenon of hybridization that can deeply modify the dispersion characteristics of the Lamb modes describing the in-plane propagation of acoustic waves in the piezoelectric substrate. The largest change in the propagation characteristics affects the transverse Lamb modes and, most specifically for thin piezoelectric substrates, the A0 mode. This is mainly determined by the fact that the A0 mode exhibits a significant displacement component along the main direction of motion for the rods (see FIG. 1C). This special feature of the proposed pRAMs can be verified by looking at FIG. 3, where the wavevector (k) relative to the propagation of the A0 mode, in the piezoelectric substrate 101, is reported for both cases in which the rods are used or not. As evident, k is significantly modified by the presence of the adopted locally resonant rods 103. As a result, the A0 mode can obtain a range of c-values that is orders of magnitude larger than the range achievable through the piezoelectric substrate 101 only. That means that orders of magnitude larger or lower c-values ($c^{(mod)}$) are possible in the proposed metamaterial structure forming the pRAMs.

In addition, because of the interaction between incident and scattered fields generated by each resonant unit, the A0 mode will start exhibiting propagation bandgaps that do not exist when only the piezoelectric substrate 101 is used. The generation of such bandgaps, which is originated from the high coupling between rods and piezoelectric substrate, makes the substrate regions underneath each rod (i.e. Regions-A 113, see FIG. 1B) unable to guide energy between adjacent periodic cells. Such inability is physically originated by the transformed dispersion characteristics relative to such regions, which make k complex and evanescent within the stop-band (see FIG. 3). Consequently, as a first order of approximation, Regions-A 113 behave as mechanical fixed boundaries placed at the edges of Regions-B 115, thus acoustically isolating each of them from the adjacent ones. Because of the piezoelectric effect, a significant electric field, E, will be generated, in the piezoelectric substrate 101, by the application of an alternated (AC) voltage between the top and bottom IDTs. For example, because of the $d_{15}$ piezoelectric coefficient of an AlN substrate coupled to lateral fringing components, such electric field will generate a series of standing A0 waves in Regions-B 115. Such acoustic waves will then be confined between adjacent Regions-A 113, thus forming the equivalent of lithographically defined bulk-acoustic Fabry Perot cavities, bounded between two acoustic mirrors.

Figure 2:
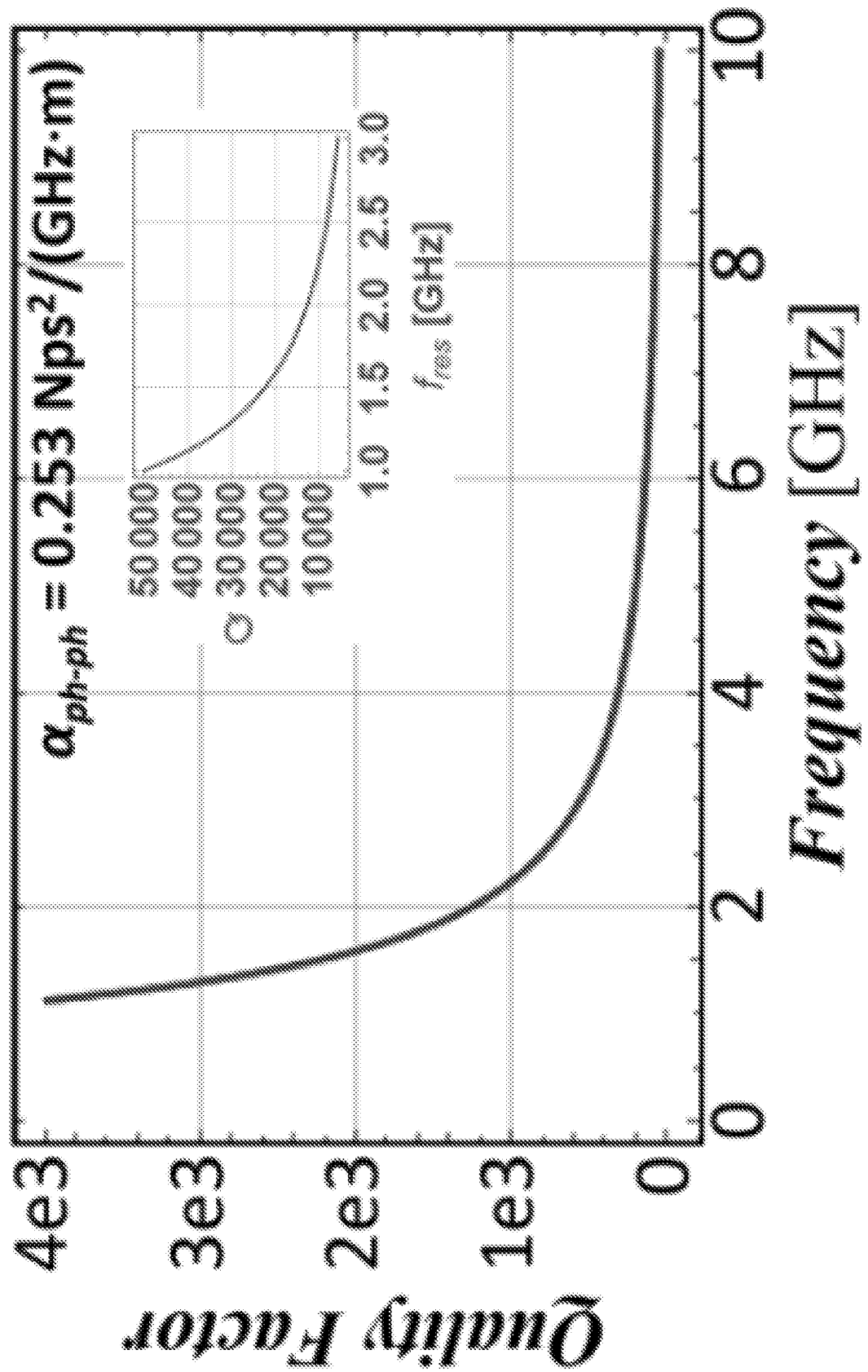
FIG. 2 is graphical plot illustrating an analytically derived trend of maximum quality factor ("Q") vs. resonant frequency for pRAMs, based on the attenuation coefficients relative to phonon-to-phonon dissipations occurring in AlN films where acoustic wavelength is considerably larger than the mean free path of phonons ("Akheiser regime").

The resonance frequency of the excited waves can be found as: fres=$n \cdot c^{(mod)}/(W^{(a)}+n \cdot \delta)$, being n the mode order, $W^{(a)}$ the width of Regions-B 115 and $\delta$ the penetration depth for the displacement field relative to the A0 mode in Regions-A 113. It is important to point out that $\delta$ is inversely proportional to the imaginary part of k ($k^{(im)}$, see FIG. 3), whose sensitivity with respect to frequency can be extremely large around fres. Also, almost all the acoustic energy produced by the excitation of such resonant mode is stored in Regions-B 115. By preventing the acoustic energy from reaching the IDTs 109,111, the rods 103 and the tuning coils 107, it is possible to completely evade any acoustic dissipation that limits, instead, the mechanical quality factor of high frequency BAW and SAW devices. Consequently, as shown in FIG. 2, pRAMs will attain record-high Q-values not limited by the large losses produced, in conventional acoustic resonators, by the metallic layers used to excite them. These values, instead, will approach for the first time the limit set by phonon-to-phonon interactions in piezoelectric substrates. In that regard, FIG. 2 illustrates an analytically derived trend of the maximum Q-value vs. fres of pRAMs, based on the attenuation coefficients extracted relative to phonon-to-phonon dissipations occurring in AlN films under the Akheiser regime (i.e. acoustic wavelength is considerably larger than the mean free path of phonons).

Moreover, this feature permits to have an additional degree of freedom on the selection of the IDTs 109,111 material and geometry. In fact, as the IDTs 109,111 are not reached by mechanical vibration, they can be made out of thick and low-resistivity metal layers, thus also evading dissipations originated from electrical loading. Ultimately, as all Regions-B are geometrically bounded by device parts characterized by an evanescent wavevector for the A0 mode, acoustic dissipations due to anchor losses are also mitigated. Consequently, we expect that that the proposed pRAMs can reach record high Q-values approaching the limit set by the acoustic losses in, for example, Aluminum Nitride (>30000 for devices operating in the Super-High-Frequency range). In addition, thanks to the magnetostrictive properties of thin film FeGaB layers, whose sputtering deposition has already been characterized and available by the inventors, the acoustic velocity (c(rod)) relative to the z-oriented extensional displacement field in the rods can be significantly tuned proportionally to the level of B and, consequently, to the DC-current flowing into the tuning coils, IDC. In particular, as demonstrated in [2], the application of B-values in excess of 10 Oe, corresponding to IDC-values in pair of 35 µA for 120 µm long pRAMs, suffices to produce a 30% decrease of $c^{(rod)}$. Such decrease determines a shift in the resonance frequency relative to the thickness-extensional ($TE^{(rod)}$) mode of vibration of the rod. As a result, modified coupling conditions occur between $TE^{(rod)}$ and the A0 mode.

Such a change slightly shifts the center frequency of the stopband for the A0 mode (FIG. 3), thus leading to a variation of $k^{(im)}$ and, consequently, of $\delta$ and fres. In other words, the ability to control $c^{(rod)}$ permits to electronically vary the distance between the equivalent mirrors confining the vibration in Regions-B. It is worth mentioning that this unexplored tuning method leads to an unprecedented sensitivity of fres vs. B that is two orders of magnitude higher than attained by state-of-the-art magnetometers based on AlN nano acoustic resonant devices embodying FeGaB layers (0.2 MHz/Oe). It is also important to emphasize that the achievement of higher $\delta$-values, at larger IDC values, produces a slowly increasing impact of Regions-A on the attainable Q. However, as most of the mechanical energy remains stored by pRAMs in Regions-B, for a wide range of IDC-values, these devices maintain high Q-values and large tuning ranges exceeding 30%.

Preliminary Simulations through Finite Element Modelling (FEM)

Figure 4:
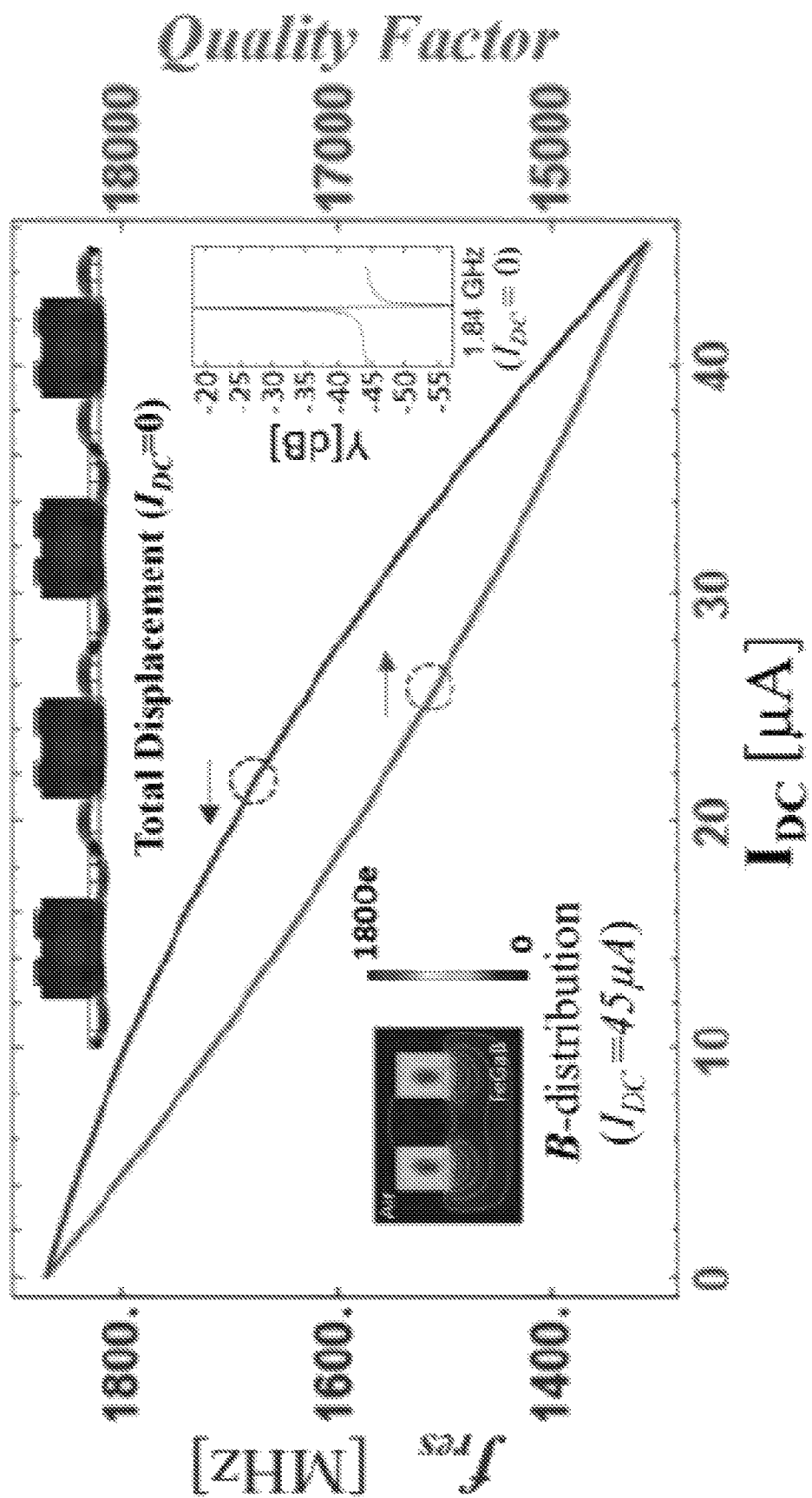
FIG. 4 is a graphical plot illustrating the relationships between resonant frequency and quality factor and DC current applied to coils of the pRAM of FIG. 1A.
Figure 5:
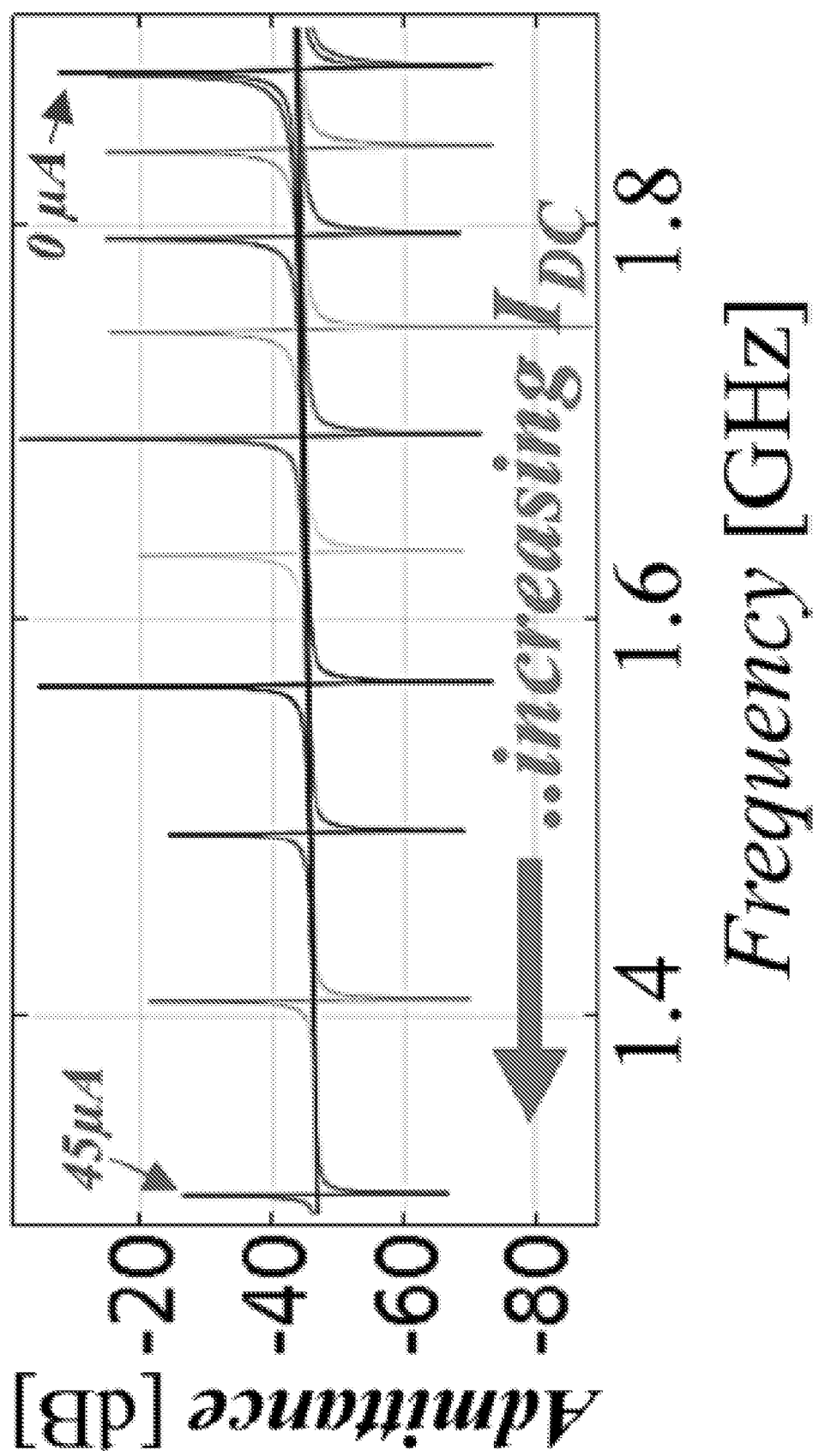
FIG. 5 is a graphical plot illustrating the relationship between frequency and admittance of the pRAM of FIG. 1A to DC current applied to coils of the pRAM.

In order to validate the special operational features of the pRAM, we designed, through Finite Element Methods (FEM), a preliminary prototype based on the adoption of a 100 nm-thick AlN-film, 50 nm-thick aluminum IDTs, 0.4 µm-thick FeGaB rods and 0.1 µm-thick nickel coils. Aluminum was chosen to form the IDTs in order to minimize the electrical loading, whereas nickel was chosen, because of its relatively high relative permeability (>400), to maximize B for a given IDC-value (see simulated B-value in FIG. 4). The width of Regions-B was chosen to set the resonance frequency of the pRAM, for IDC=0, to ~1.9 GHz. Different IDC-values were considered (from 0 to 45 µA) to estimate the attainable change of fres. FIG. 4 illustrates the simulated values, through FEM, of fres and Q for the designed pRAM. The corresponding FEM simulated admittances are also reported in FIG. 5. As shown in FIG. 4, a large sensitivity of fres vs. IDC was simulated (~12 MHz/μA, equivalent to a sensitivity to B in pair of 37 MHz/Oe), thus leading to an unprecedented tuning range of fres exceeding 30%. In parallel, while there is a reduction of Q due to the higher δ, at increasing IDC-values, the simulated pRAM showed Q-values always higher than 14000 throughout the entire range of tunability. As evident from the simulated mode shape distribution relative to the total displacement of the designed pRAM (FIG. 3), the achievement of such high Q-values is made possible by its unique modal characteristics that allow to confine almost the entire acoustic energy in its Regions-B, thus far from the Al IDTs and from the FeGaB rods. It is also important to point out that a low DC power equal to 0.3 μW is required, for each nickel coil, to attain an IDC-value in pair of 45 μA. Such a reduced power consumption implies that tunable pRAMs characterized by total series resistance values lower than 1Ω can be attained, while consuming less than 3 μW.

Although largely shown and described herein as including an AlN substrate with FeGaB magnetostrictive members having nickel ("Ni") coils, it will be apparent in view of this disclosure that other materials can be used in accordance with various embodiments. For example, Aluminum Scandium Nitride (AlScN) substrates may be used to build Lamb wave acoustic resonators with enhanced $kt^2$. This piezoelectric alloy exhibits higher piezoelectric coefficients than those of conventional AlN films Consequently, its use in piezoelectric resonators permits to attain higher kt 2 than what possible through the adoption of AlN as the piezoelectric material. Therefore, AlScN pRAMs will achieve a higher $kt^2$ (up to 7%) than the AlN counterparts. Such an increased coupling coefficient will allow to build RF filters with bandwidth that is large enough to meet the stringent requirements of LTE radios, thus paving the way to revolutionize existing 1G-to-4G mobile architectures in addition to next generation technologies. In some embodiments, pRAMs may use AlScN films using scandium doping concentrations ranging from 10% to 40%.

DRAM Channel-Select-Filters ("CSFs")

Figure 7:
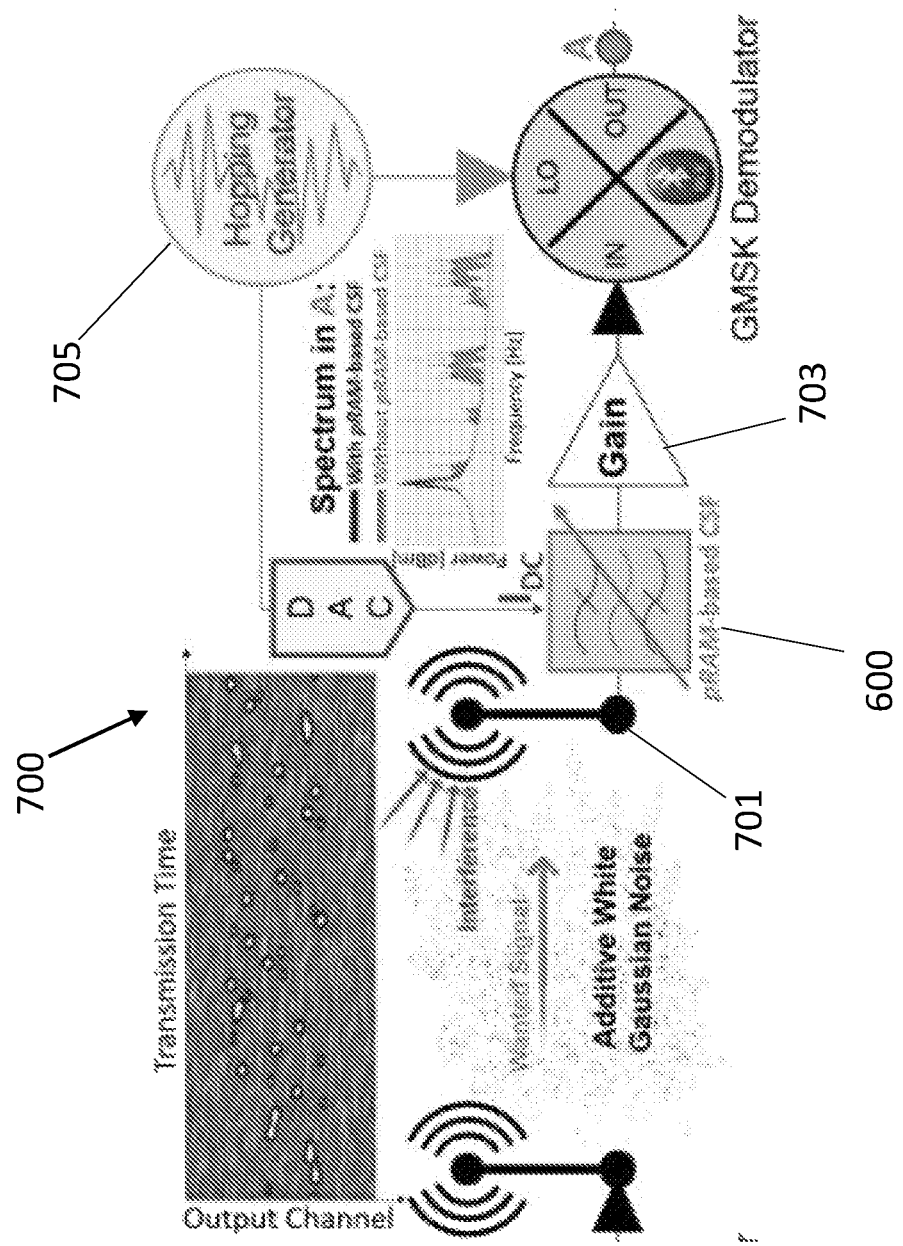
FIG. 7 is a schematic view of a Bluetooth Low-Energy system incorporating the pRAM CSF in accordance with various embodiments.

As the number of commercial and military wireless nodes keeps increasing, it is becoming crucial to render their receivers ("RXs") more immune to the increasing interference levels in the electromagnetic medium. While in the last decades the adoption of spread-spectrum techniques has provided means to achieve RXs with more interference resilience, the use of these techniques alone only obtains a limited processing gain (<20 dB). Consequently, current wireless nodes keep facing bigger and bigger risks of exhibiting degraded performance, due to the increasing congestion of the spectral scenario in which they operate. For example, as shown in FIG. 7, a Bluetooth-Low-Energy ("BLE") receiver 700 can receive, via an antenna 701, both a wanted signal (or "signal of interest") and numerous sources of noise and interference.

The development of pRAM-based CSFs will surpass this technological barrier. pRAM-based CSFs 600, in fact, will allow to dynamically track, directly at RF, the changes of the communication channel as defined by the pre-agreed hopping sequence, driven by hopping generator 705. By doing so, pRAM CSFs produce an increase of the attainable processing gain 703, approaching the upper limit of random jitter ("RJ") (>40 dB) within the system 700. This increase in gain results in substantially increased resilience to interference in wireless nodes with a lower power consumption and a longer battery lifetime, while also permitting operation at higher data-rates to exchange larger data volumes. Thereby, pRAM-based CSFs will enable further development of widely deployed IoT technologies, like ZigBee, IEEE 802.15.4, and Bluetooth-Low-Energy (BLE, IEEE 802.15.6). The development of pRAM-based CSFs 600 will also improve the functionalities of the software-defined-radios by providing them with the means to achieve a fast and high-resolution front-end reconfiguration.

Figure 6A:
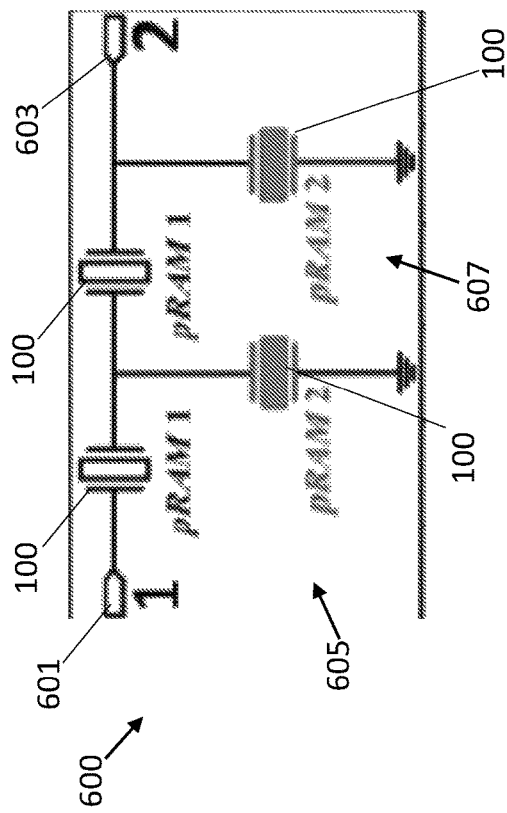
FIG. 6A is a schematic view illustrating a fourth-order channel-select-filter ("CSF") having integrated pRAMs ("pRAM CSF") in accordance with various embodiments.
Figure 6B:
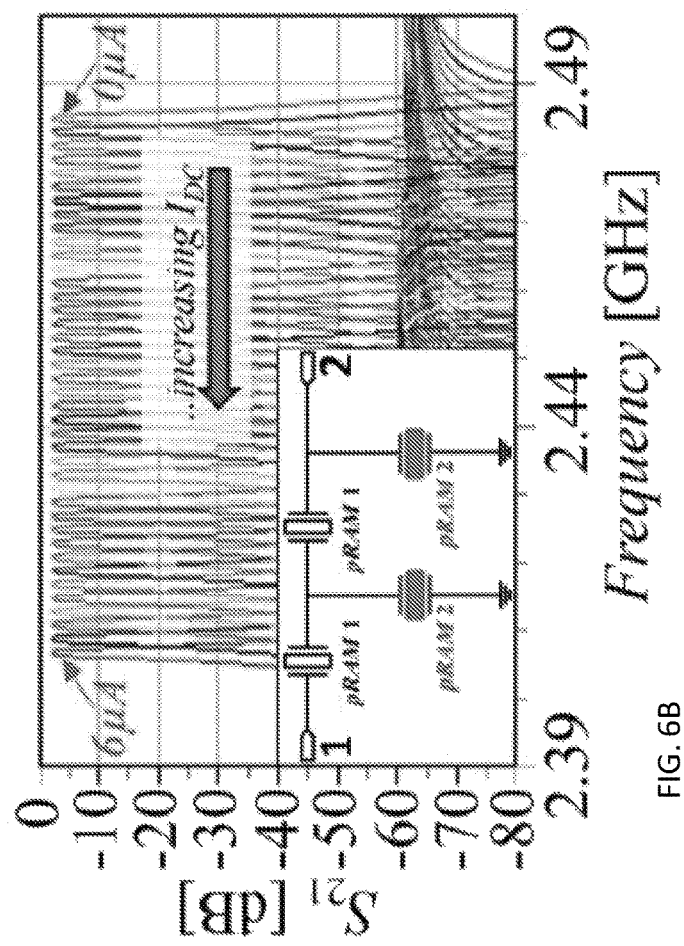
FIG. 6B is a graphical plot illustrating the relationship between S21 transmission and frequency of the pRAM CSF to DC current applied to coils of the pRAMs.

The development of pRAMs will also enable high performance CSFs for low power integrated RF front-ends. Referring now to FIGS. 6A and 6B, pRAM CSFs can generally include 2-port 601,603 networks 600 formed by a set of monolithic integrated electrically coupled pRAMs 100, properly designed to ensure an optimal operation, for example, when interfaced with 50Ω matched electronics. Because of the high-Q and high-TR exhibited by pRAMs, pRAM-based CSFs 600 will be able to achieve narrow bandwidths ("BWs") (as low as 1 MHz), low IL (<2 dB), large RJ (>40 dB, relative to a 2 MHz separation from the center frequency) and a large tuning range ("TR") of their center frequency (>30%). For demonstration purposes, as shown in FIG. 6A, a FEM model of a 4th-order pRAM-based CSF 600 was simulated for use in commercial BLE RXs. This filter relies only on two sets of resonators 605, 607, manufacturable through the same fabrication process. The fres and the capacitance value of each adopted resonator 100 can be chosen such that only one IDC-value, lower than 6 μA (corresponding to a DC power of 3 μW), is needed to reconfigure its center frequency and make it suitable to cover any one of the available BLE channels. The performance of the pRAM CSF was then analyzed for different IDC-values. As evident from FIG. 6B, due to the high-Q exhibited by pRAMs, the simulated IL- and RJ-values of the designed CSF are almost insensitive to IDC.

Figure 8:
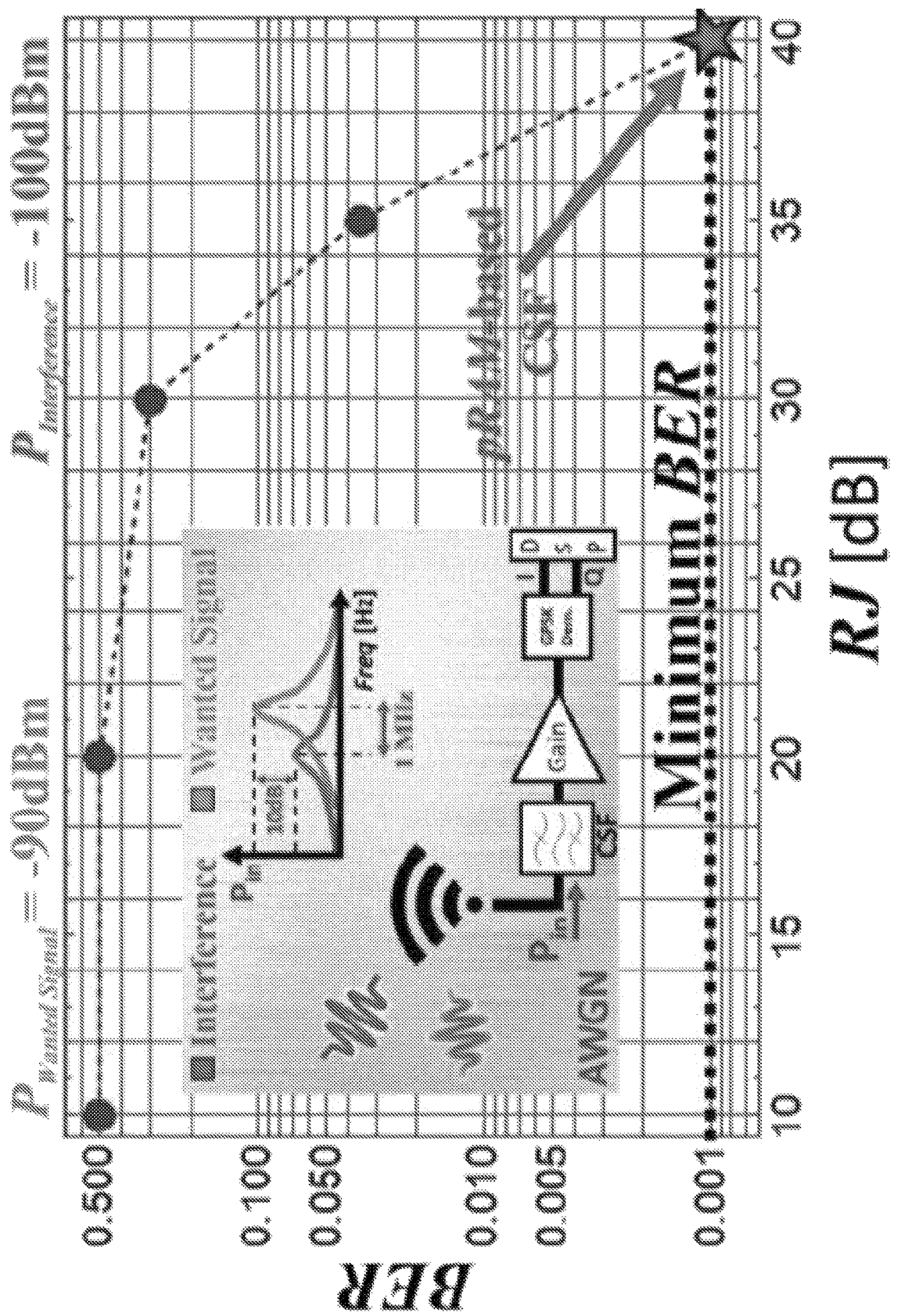
FIG. 8 is a graphical plot illustrating the relationship between bit-error-rate ("BER") and random jitter ("RJ") for a Bluetooth Low-Energy receiver incorporating a pRAM CSF.

FIG. 8 illustrates the benefit of the pRAM CSF with respect to the bit-error-rate (BER) as compared to a conventional BLE RX exposed to a strong adjacent-channel-interference signal. The conventional BLE RX was provided with a CSF having the same BW and IL of the designed pRAM-based CSF shown in FIG. 6A but, because it lacked the pRAM CSF, variant RJ extending between 10 dB and 40 dB. These results show that pRAM-based CSFs, such as those illustrated in FIG. 6A, will enable miniaturized BLE RXs characterized by a low sensitivity (<−93 dBm) and a high linearity, yet able to receive the desired information, even when operating under extraordinarily low carrier-to-interference (C/I) ratios (10 dB/−29 dB for 1 MHz/2 MHz distant channel interference signals and when no hopping strategy is considered).

It will further be apparent in view of this disclosure that pRAM-based CSFs can be used for BLE applications exploiting ladder, lattice, and/or hybrid topologies in accordance with various embodiments. In general, such topologies will rely on monolithic integrated pRAMs, resonating at different frequencies and characterized by optimal capacitance values. In some embodiments, it may be preferable to select the pRAM design such that all the BLE channels can be covered by a single pRAM CSF, which can be done while ensuring optimal performance, a negligible increase of power consumption and no distortion or noise figure degradation.

pRAM Tunable Frequency Generators ("FS")

Figure 9B:
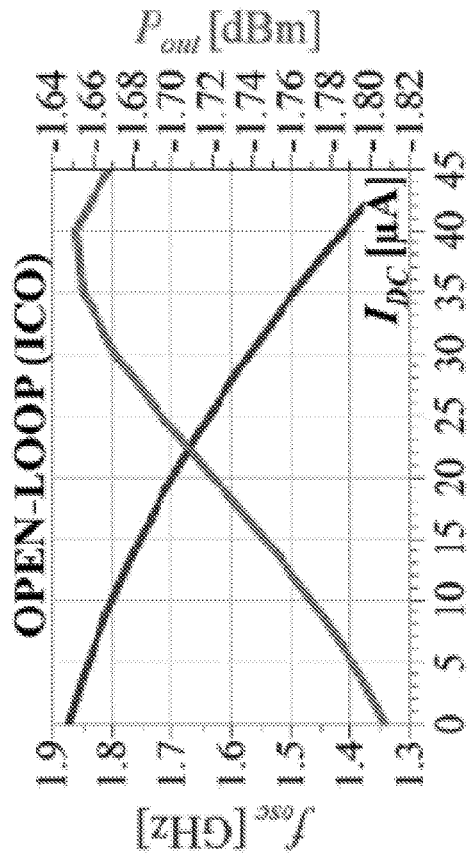
FIG. 9B is a graphical plot illustrating the relationship between output frequency ("$f_{osc}$" or "$f_{out}$") and output power of the pRAM ICO to DC current applied to coils of the pRAM.
Figure 9C:
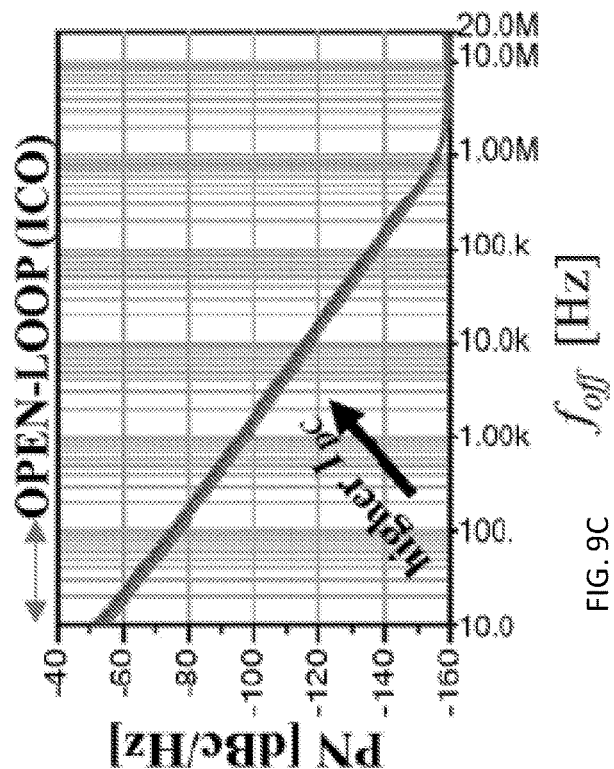
FIG. 9C is a graphical plot illustrating the relationship between output phase noise ("PN") and offset frequency ("$f_{off}$") of the pRAM ICO.
Figure 9A:
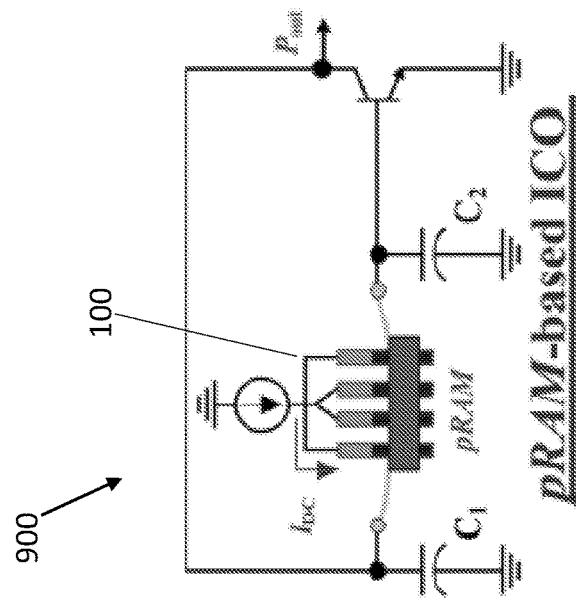
FIG. 9A is a schematic illustrating a current-controlled-oscillator ("ICO") integrating a pRAM ("pRAM ICO") in accordance with various embodiments.
Figure 10A:
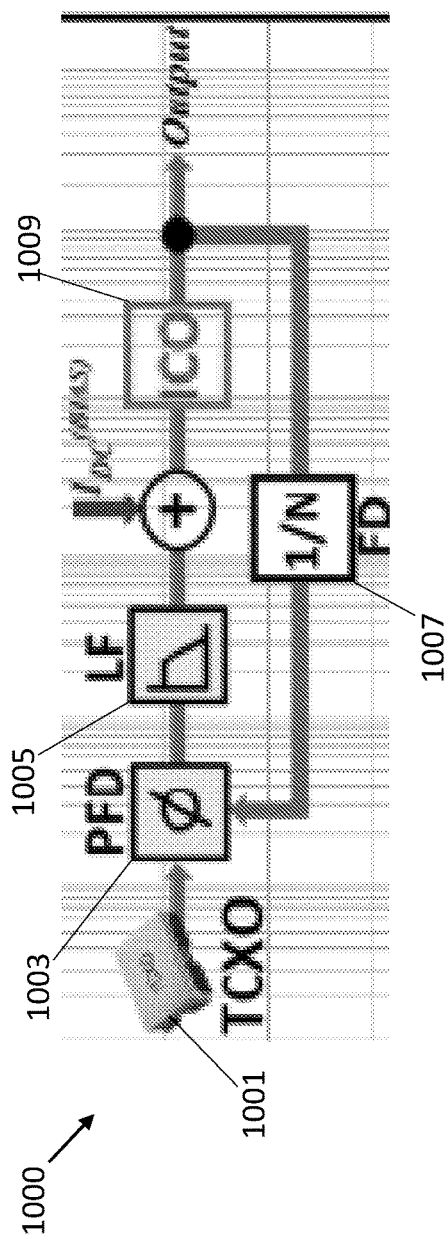
FIG. 10A is a schematic diagram of a tunable frequency generator ("FS") including a pRAM ICO ("pRAM FS") in accordance with various embodiments.
Figure 10B:
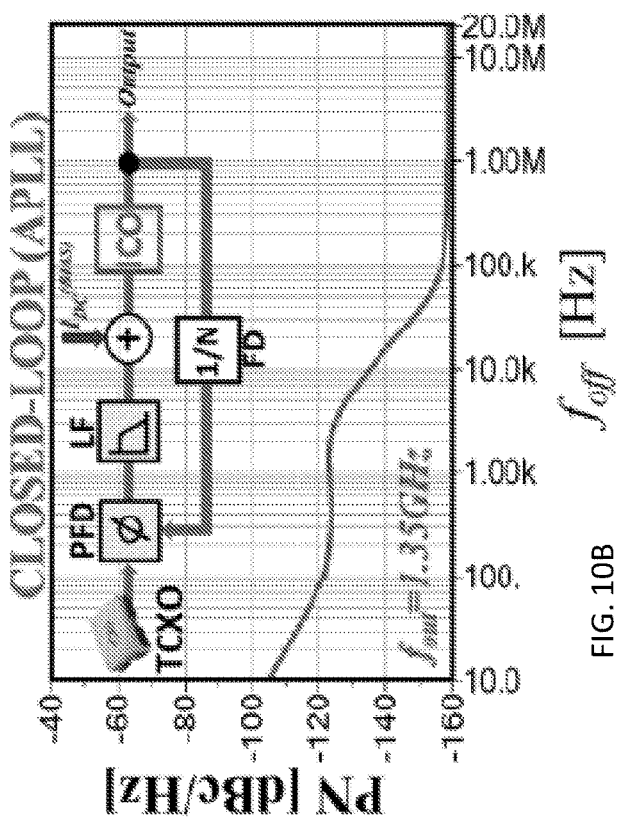
FIG. 10B is a graphical representation illustrating the relationship between output phase noise ("PN") and offset frequency ("$f_{off}$") of the pRAM FS.
Figure 11:
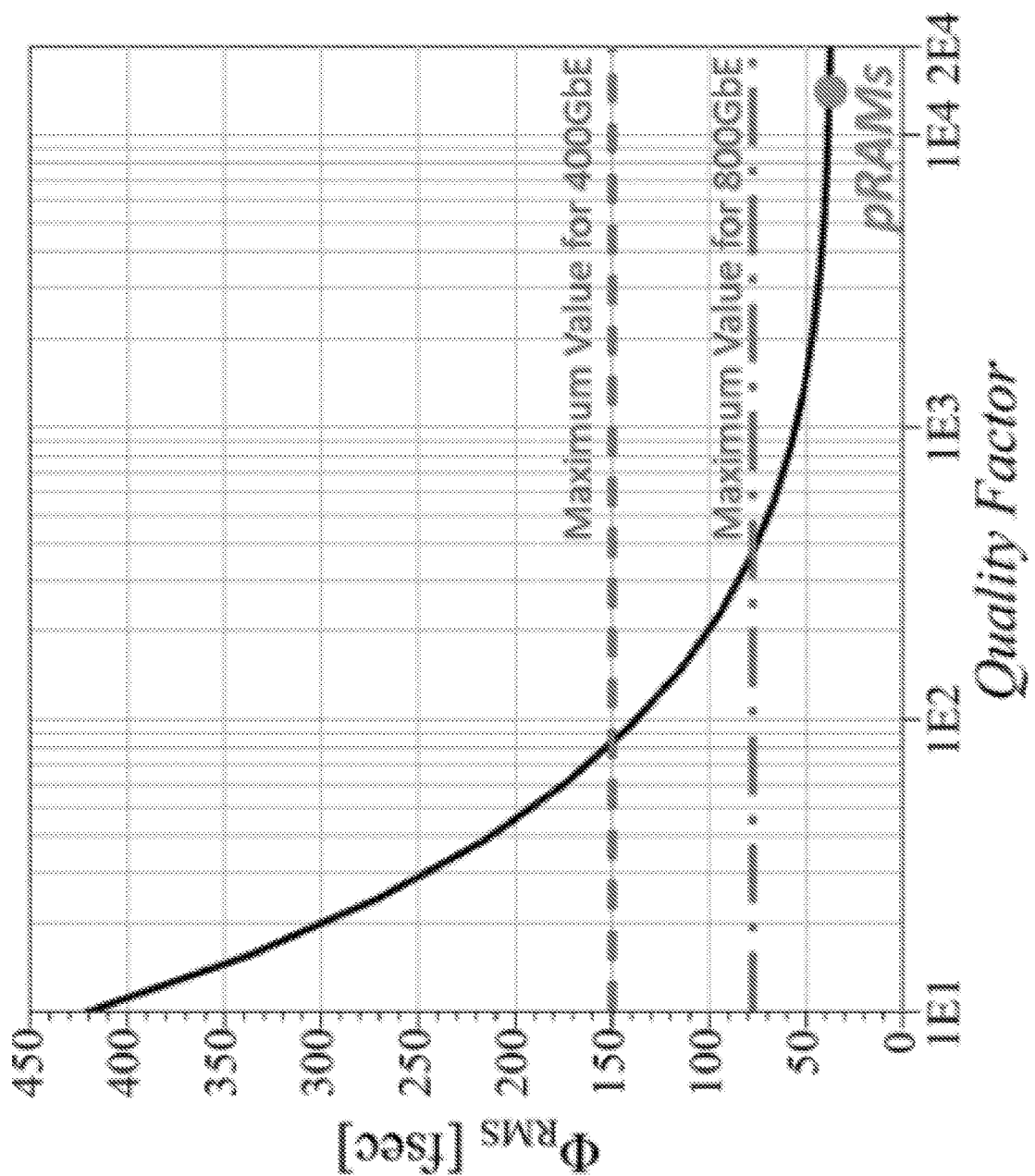
FIG. 11 is a graphical plot illustrating jitter ("$\Phi_{RMS}$") vs. quality factor associated with the pRAM FS.
Figure 12:
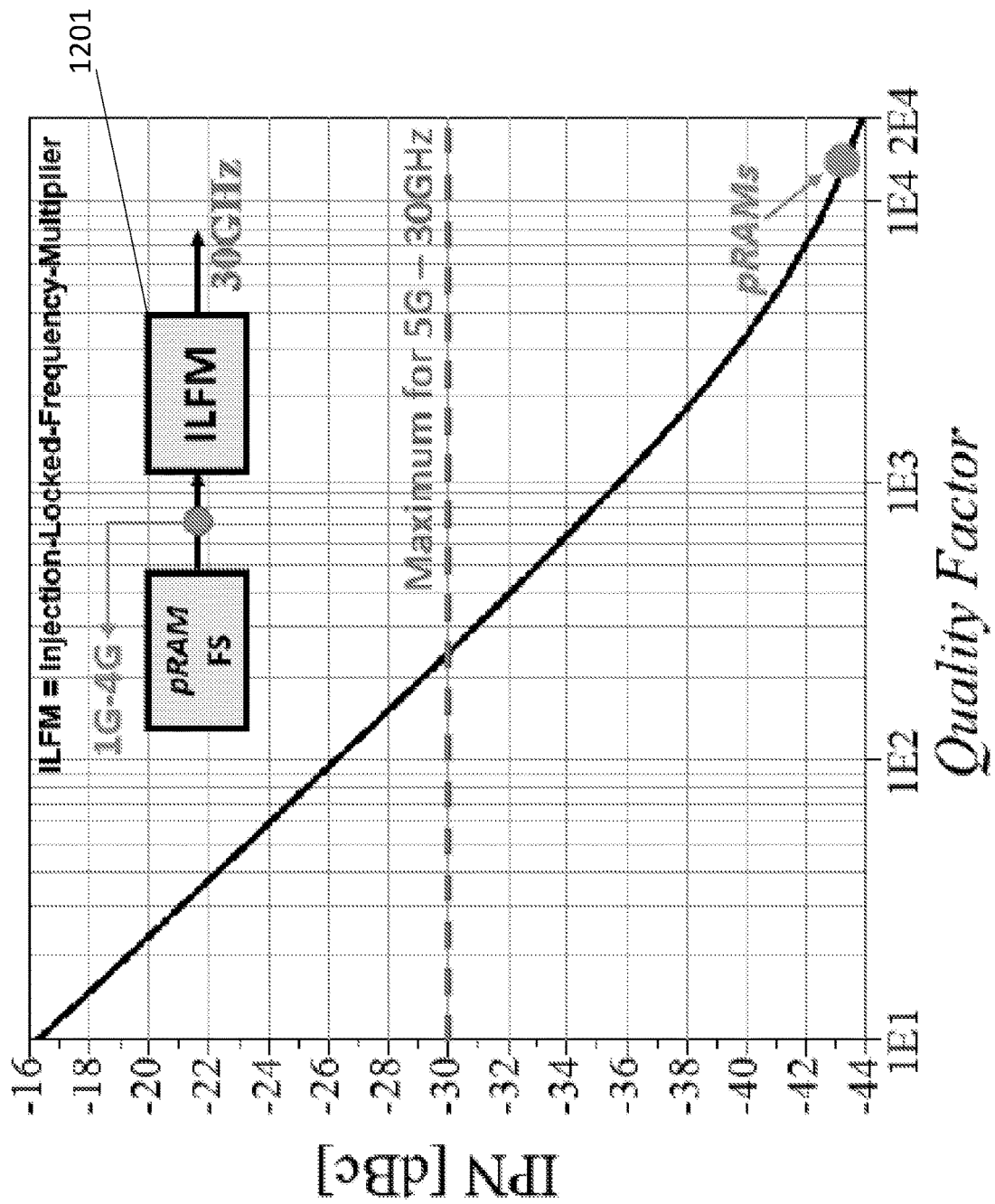
FIG. 12 is a graphical plot illustrating integrated phase noise ("IPN") vs. Q-value wherein the pRAM FS is used in conjunction with an Injection-Locked-Frequency-Multiplier ("ILFM").

The demand of larger information volumes, exchanged at continuously rising speeds, is amplifying the quest for new networking components capable to exploit the unprecedented data-rates granted by higher terabit Ethernet generations such as 400 GbE. However, this technological leap can only be made after developing network synthesizers able to exploit higher order encoding schemes to transmit, at unprecedented rates, massive data through noisy and pathological channels. Unfortunately, these synthesizers require integrated FSs capable to achieve much lower RMS jitter levels (ΦRMS lower than 150 fsec for 400 GbE and for frequency offsets ranging from 12 kHz to 20 MHz) than attained by the state-of-the-art (SoA) integrated LC-based counterparts (>310 fs, see FIG. 4). In order to surpass this limitation, we will develop a new class of FSs exploiting, for the first time, the unique performance features of pRAMs. These pRAM-based FSs will be able to achieve significantly lower ΦRMS-values than what attained by the existing counterparts operating in the same frequency range. Such reduced jitter levels, which will be significantly lower than the maximum tolerated by 400 GbE line and time cards (see FIG. 11), will even create a revolutionary path towards 800 GbE counterparts, capable of processing data-rates approaching 800 Gbps. In fact, although 800 GbE network synthesizers will have lower tolerance, requiring lower ΦRMS-values (75 fs) than the 400 GbE counterparts (150 fsec), the pRAM-based FSs disclosed herein can achieve even lower ΦRMS-values (~35 fs). Such low jitter exhibited by pRAM-based FSs in wired networks will facilitate expected migration towards new data-centers capable, in a few years, to process hundreds of zettabytes. Such data-centers will permit hardware capability to begin to fully exploit technological advancements introduced by many computing applications, such as cloud-storage, edge computing, machine learning and artificial intelligence (AI). Moreover, pRAMs will also pave the way towards mm-wave FSs, finally giving fifth-generation (5G) radios access to higher-order modulation schemes, even beyond 64 Quadrature-Amplitude-Modulation (64 QAM). By enabling the use of such schemes, these radios will be able to transmit more data within the same bandwidth. In fact, because of the poor phase-noise attained by mm-wave voltage-controlled-oscillators (VCOs) and thanks to the lack of energy efficient mm-wave frequency dividers, the currently available 5G FSs still rely on lower frequency counterparts, based on off-chip high-Q oscillators. Such lower frequency FSs drive a set of low-noise Injection-Locked-Frequency-Multipliers (ILFMs) 1201 as shown in FIG. 12 to achieve the desired stable higher frequency output signals. The phase-noise added by ILFMs 12001 increases as their frequency multiplication factor is augmented, however stable CMOS-compatible FSs operating in the UHF range are strongly desired to minimize the IPN-value attained by fully integrated mm-wave FSs (see FIG. 12). In addition, the availability of stable UHF FSs allows to expand the limited lock range and to reduce the sensitivity to process and temperature variations exhibited by mm-wave ILFMs 1201, without requiring additional noisy and power-hungry circuits. For these reasons, the pRAM-based FSs disclosed herein can fill the void of mm-wave counterparts, exhibiting, as shown in FIG. 12, an ultra-low level of Integrated-Phase-Noise (IPN<−43 dBc computed between 1 kHz and 100 MHz from a 30 GHz carrier, see FIG.). Such a low IPN-value is approximately thirty times lower than the maximum IPN tolerated by 30 GHz 5G radios exploiting 64 QAM pRAMs will also enable tunable FSs characterized by extraordinarily low ΦRMS-values. Differently from conventional counterparts relying on a VCO, as shown in FIGS. 9A-9C, pRAM-based FSs can use a current-controlled-oscillator (ICO) 900 having an output frequency set by one pRAM 100. As shown in FIGS. 10A and 10B, this ICO 900 can then be inserted into an analog-phased-locked loop ("APLL") 1000, also including a phase-frequency-detector (PFD) 1003, a loop filter (LF) 1005, and a programmable frequency divider (FD)1007. The APLL 1000 will be driven by the stable output of a low-frequency temperature compensate crystal oscillator (TCXO) 1001. Additionally, once inserted in the APLL1000, the pRAM 100 in the ICO will be controlled by an IDC-value sum of two separate currents: i) a biasing current (IDC(BIAS)), responsible for setting/tuning the FS output frequency (fout); ii) a time-varying control-current, coming from the LF 1005 and proportional to the output voltage of the PFD 1003. The circuit simulated output frequency (fosc), the output power (Pout) and the output phase-noise (PN) relative to a preliminary designed Pierce pRAM-based UHF ICO are illustrated in FIGS. 9A-9C. In one prototype, the designed ICO 900, which uses the pRAM100 as the frequency setting component and available measured electrical models of commercial components for its remaining parts, were analyzed for different IDC(BIAS)-values, ranging from 0 to 45 μA. As evident, the designed ICO 900 simultaneously exhibits a wide tuning range (>30%), high Pout (>−2 dBm), and low PN values between 12 kHz and 20 MHz frequency offsets (foff), corresponding to VMS-values that remain lower than 23 fsec for all the explored IDC-values. The designed ICO was then used to assess the frequency stability of a pRAM-based APLL 1000 (FIG. 10A). In order to do so, an ad-hoc LF 1005 was designed and it was assumed that off-the-shelf PFD 1003, FD 1007, and TCXO 1001 components would be adopted. Upon analysis of the FS simulated performance, it was found that ΦRMS-values always lower than 30 fsec can be attained, for IDC(BIAS)-values varying between 0 and 45 μA (corresponding to output frequencies ranging from 1.35GHz to 1.85GHz, although it will be apparent in view of this disclosure that any Ultra- or Super-high frequencies i.e. 300 MHz to 30 GHz can be used in accordance with various embodiments). This simulated ΦRMS-value is significantly lower than the maximum value tolerated by networks synthesizers for both 400 GbE and 800 GbE (see FIG. 11). Also, when neglecting the low noise produced by the available ILFMs, the up-converted output of the designed FS exhibits an IPN-value lower than −43 dBc, for a 30 GHz carrier. This IPN value is also much smaller than the maximum value tolerated by 5G radios using 64 QAM.

pDRAM Magnetometers

Figure 13:
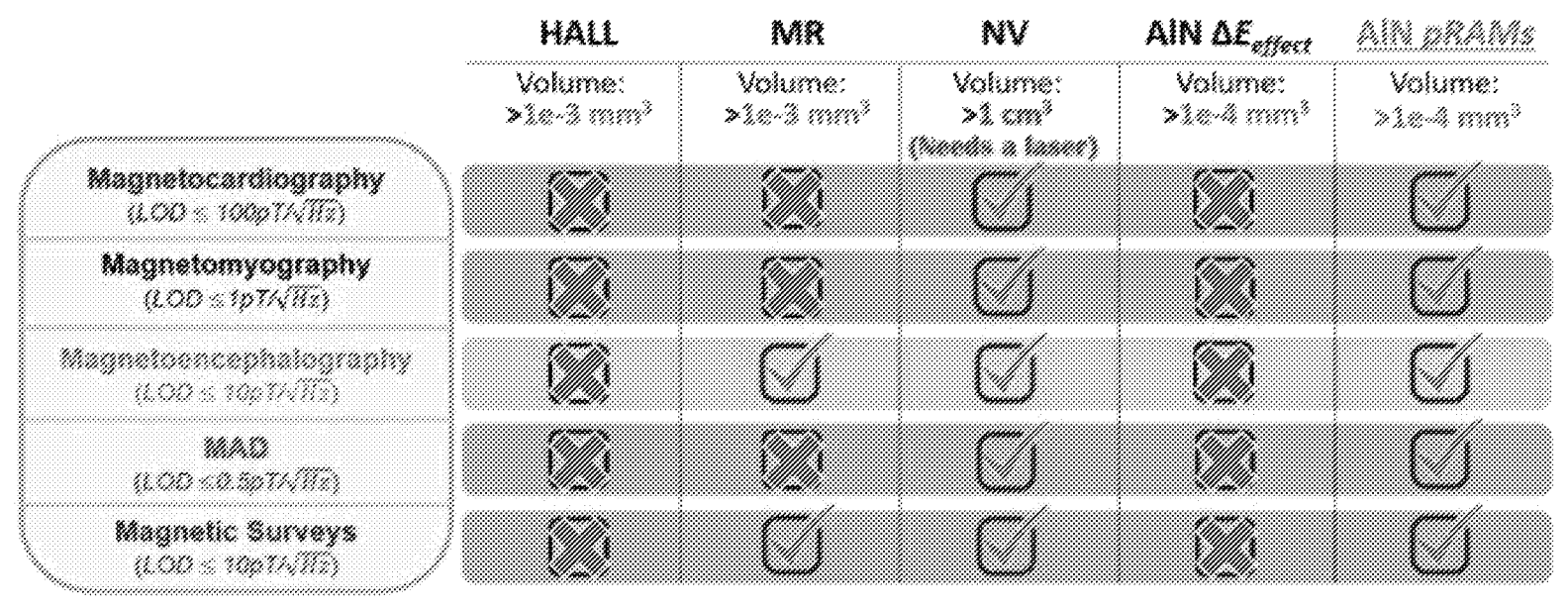

The unprecedented sensitivity to magnetic fields achieved by the pRAMs disclosed herein, along with their superior quality factor (>10000), also provide the means to achieve a new class of CMOS-compatible magnetometers ("pRAM magnetometers"). As shown in FIG. 13, these sensors achieve a much lower limit-of-detection (LoD) than any other available chip-scale counterparts, without any requirement that they be biased or cooled. Furthermore, pRAM magnetometers also provide an ultra-low spatial resolution due to a very low volume (≤0.0001 mm3). Similar to prior art AlN "ΔE-effect" magnetometer sensor, the LoD of pRAM-based magnetometers is inversely proportional to the sensitivity of the resonance frequency vs. B and to their Q. However, unlike such counterparts, pRAM-based magnetometers do not rely on the "ΔE-effect" to generate the magnetostrictively induced change infres. Therefore, pRAM magnetometers do not require a large mechanical energy being stored in the lossy magnetostrictive layer needed for sensing. This feature, which is granted by the unique acoustic modal behavior of pRAMs, renders these devices able to achieve >10 times higher Q-values and >100 times more sensitive fres-values to B than the previously reported AlN devices. Consequently, AlN pRAM-based magnetometers will enable a >1000 lower LoD (~0.2 pT/√Hz at DC) than the LoD attained by state of the art AlN counterparts (210 pT/√Hz) and will be able to sense B values that can be much lower than 1 pT/√Hz. Thus, pRAM magnetometers will not only be able to replace bulky and high-power magnetic sensors, such as fluxgate and the giant magnetoimpedance magnetometers (GMI), but they will also provide the means to substitute the big, expensive and cryogenically cooled SQUID-based magnetometers in biomagnetic and environmental applications, which demand LoDs in the sub-pT/√Hz range (see FIG. 13). Moreover, differently from the emerging magnetometers based on Nitrogen Vacancy (NV) centers in diamond, pRAM-based magnetometers will be entirely integratable in a CMOS-process and will not require large off-chip components, such as optical fibers or lasers.

While the present technology has been described in conjunction with certain preferred embodiments, one of ordinary skill, after reading the foregoing specification, will be able to effect various changes, substitutions of equivalents, and other alterations to the compositions and methods set forth herein.

The present technology and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the technology. The examples used herein are intended merely to facilitate an understanding of ways in which the technology may be practiced and to further enable those of skill in the art to practice the embodiments of the technology. Accordingly, the examples and embodiments herein should not be construed as limiting the scope of the technology. Moreover, it is noted that like reference numerals represent similar parts throughout the several views of the drawings.

As used herein, "consisting essentially of" allows the inclusion of materials or steps that do not materially affect the basic and novel characteristics of the claim. Any recitation herein of the term "comprising", particularly in a description of components of a composition or in a description of elements of a device, can be exchanged with the alternative expressions "consisting essentially of" or "consisting of".

What is claimed is:

1. A piezoelectric acoustic metamaterial resonator, comprising:
   a piezoelectric substrate having a top surface and a bottom surface; and
   a plurality of magnetostrictive members disposed on the top surface of the piezoelectric substrate and extending along a length of the piezoelectric substrate and spaced across a width of the piezoelectric substrate,
   wherein each of the magnetostrictive members includes a coil set which, when energized, produces a magnetic field that affects a mechanical property of the magnetostrictive members,
   wherein the coil set for each magnetostrictive member is disposed on a top surface of the magnetostrictive member, and
   wherein the coil set for each magnetostrictive member is configured to be energized with a DC current to change the Young's modulus of the magnetostrictive member.

2. A piezoelectric acoustic metamaterial resonator, comprising:
   a piezoelectric substrate having a top surface and a bottom surface;
   a plurality of magnetostrictive members disposed on the top surface of the piezoelectric substrate and extending along a length of the piezoelectric substrate and spaced across a width of the piezoelectric substrate; and
   a coil set including a coil proximate to but physically separated from each magnetostrictive member which, when energized, produces a magnetic field that affects a mechanical property of at least one of the magnetostrictive members.

3. The piezoelectric acoustic metamaterial resonator of claim 2 wherein the coil set is included in a chip package containing the piezoelectric acoustic metamaterial resonator.

4. A piezoelectric acoustic metamaterial resonator, comprising:
   a piezoelectric substrate having a top surface and a bottom surface;
   a plurality of magnetostrictive members disposed on the top surface of the piezoelectric substrate and extending along a length of the piezoelectric substrate and spaced across a width of the piezoelectric substrate; and
   at each of the magnetostrictive members:
     a first electrode, having a first polarity, disposed between a corresponding one of the magnetostrictive members and the top surface of the piezoelectric substrate; and
     a second electrode, having a second polarity, opposite the first polarity, disposed on the bottom surface of the piezoelectric substrate opposite the first electrode,
   wherein the polarity of the first electrode of each successive magnetostrictive member of the plurality of magnetostrictive members alternates between positive and negative when an AC voltage is applied across each of the first and second electrodes.

5. The piezoelectric acoustic metamaterial resonator of claim 4, wherein the first and second electrodes comprise aluminum.

6. A piezoelectric acoustic metamaterial resonator, comprising:
   a piezoelectric substrate having a top surface and a bottom surface; and
   a plurality of magnetostrictive members disposed on the top surface of the piezoelectric substrate and extending along a length of the piezoelectric substrate and spaced across a width of the piezoelectric substrate,
   wherein each of the magnetostrictive members includes a coil set which, when energized, produces a magnetic field that affects a mechanical property of the magnetostrictive members, and
   wherein each coil set further comprises:
     a coil; and
     an electrically insulating layer interposed between the coil and the top surface of the magnetostrictive member.

7. A piezoelectric acoustic metamaterial resonator, comprising:
   a piezoelectric substrate having a top surface and a bottom surface;
   a plurality of magnetostrictive members disposed on the top surface of the piezoelectric substrate and extending along a length of the piezoelectric substrate and spaced across a width of the piezoelectric substrate; and a plurality of periodic cells, each including:
a first region extending along a width of each of the magnetostrictive members; and
a second region extending along the width of the spacing between two of the magnetostrictive members.

8. The piezoelectric acoustic metamaterial resonator of claim 7, wherein the piezoelectric acoustic metamaterial resonator is configured to generate bandgaps in the first region responsive to the application of the AC voltage across each of the first and second electrodes simultaneous with energizing a coil of the magnetostrictive member with a DC current to change a mechanical property of the magnetostrictive member, the bandgaps preventing the first region from guiding energy between adjacent periodic cells to acoustically isolate the second region of the periodic cell from the adjacent periodic cells.

9. The piezoelectric acoustic metamaterial resonator of claim 7, the piezoelectric acoustic metamaterial resonator configured to generate standing acoustic waves in the second region responsive to the application of the AC voltage across each of the first and second electrodes simultaneous with energizing a coil of the magnetostrictive member with a DC current to change a mechanical property of the magnetostrictive member.

10. The piezoelectric acoustic metamaterial resonator of claim 9, wherein a resonant frequency of the standing acoustic waves is: $f_{res}=n \cdot c(mod)/(W(a)+n \cdot \delta)$, wherein n is a mode order of the standing waves, W(a) is a width of the second region, and $\delta$ a penetration depth for a displacement field relative to the A0 mode in the first region.

11. A piezoelectric acoustic metamaterial resonator comprising:
a piezoelectric substrate having a top surface and a bottom surface;
a plurality of magnetostrictive members disposed on the top surface of the piezoelectric substrate and extending along a length of the piezoelectric substrate and spaced across a width of the piezoelectric substrate;
each magnetostrictive member having a coil set disposed on a top surface thereof and including:
a coil which is configured to be energized with a DC current to change the Young's modulus of the magnetostrictive member, and
an electrically insulating layer interposed between the coil and the top surface of the magnetostrictive member; and
at each of the magnetostrictive members:
a first electrode, having a first polarity, disposed between a corresponding one of the magnetostrictive members and the top surface of the piezoelectric substrate, and
a second electrode, having a second polarity, opposite the first polarity, disposed on the bottom surface of the piezoelectric substrate opposite the first electrode,
wherein the polarity of the first electrode of each successive magnetostrictive member of the plurality of magnetostrictive members alternates between positive and negative when an AC voltage is applied across each of the first and second electrodes.

12. A method for tuning a piezoelectric acoustic metamaterial resonator, comprising:
applying an AC voltage across each of a plurality of first and second electrodes, the first electrode having a first polarity and being disposed between a corresponding one of a magnetostrictive members and a top surface of a piezoelectric substrate on which the magnetostrictive members are disposed and the second electrode having a second polarity, opposite the first polarity and being disposed on a bottom surface of the piezoelectric substrate opposite the first electrode, wherein a polarity of the first electrode of each successive magnetostrictive member of the plurality of magnetostrictive members alternates between positive and negative; and
energizing, for at least one of the magnetostrictive members, a coil of a coil set disposed on a top surface thereof to produce a magnetic field to alter a mechanical property of the corresponding magnetostrictive member, wherein each of the magnetostrictive members includes one of the coil sets.

13. The method of claim 12, wherein the step of energizing further comprises applying a DC current to the coil to change the Young's modulus of the magnetostrictive member.

14. The method of claim 13, further comprising adjusting the DC voltage to alter the magnetic field to change an acoustic property of the piezoelectric acoustic metamaterial resonator.

15. The method of claim 14, wherein the acoustic property is a resonance frequency of the piezoelectric acoustic metamaterial resonator.

16. A channel-select-filter comprising:
a two-port network; and
a plurality of electrically coupled piezoelectric acoustic metamaterial resonators integrated into the two-port network, each piezoelectric acoustic metamaterial resonator including:
a piezoelectric substrate having a top surface and a bottom surface, and
a plurality of magnetostrictive members disposed on the top surface of the piezoelectric substrate and extending along a length of the piezoelectric substrate and spaced across a width of the piezoelectric substrate,
wherein the plurality of electrically coupled piezoelectric acoustic metamaterial resonators further comprises two pair of electrically coupled piezoelectric acoustic metamaterial resonators configured to provide a fourth order filter.

17. The channel-select-filter of claim 16, wherein the channel-select-filter is integrated within a low-power radio.

18. The channel-select-filter of claim 16, wherein the channel-select-filter is integrated within a Bluetooth-Low-Energy beacon.

19. The channel-select-filter of claim 16, wherein the channel-select-filter is integrated within a software-defined radio.

20. A tunable frequency generator comprising:
a current-controlled oscillator including:
a piezoelectric acoustic metamaterial resonator having:
a piezoelectric substrate having a top surface and a bottom surface, and
a plurality of magnetostrictive members disposed on the top surface of the piezoelectric substrate and extending along a length of the piezoelectric substrate and spaced across a width of the piezoelectric substrate;

an analog phase-locked loop including:
  the current-controlled oscillator,
  a phase-frequency detector,
  a loop filter, and
  a programmable frequency divider; and
a low-frequency temperature compensated crystal oscillator in electrical communication with the analog phase-locked loop, the analog phase-locked loop being driven by a stable output of the low-frequency temperature compensated crystal oscillator.

21. The tunable frequency generator of claim 20, wherein the piezoelectric acoustic metamaterial resonator includes the piezoelectric acoustic metamaterial resonator of claim 1.

22. The tunable frequency generator of claim 20, wherein the piezoelectric acoustic metamaterial resonator is controlled by a DC current composed of a sum of:
  a DC biasing current configured to set an output frequency of the tunable frequency generator; and
  a time-varying control-current output by the loop filter and proportional to the output voltage of the programmable frequency divider.

23. The tunable frequency generator of claim 20, wherein the tunable frequency generator is integrated into at least one of a fourth-generation (4G) radio, a fifth-generation (5G) radio, or a sixth-generation (6G) radio.

* * * * *